United States Patent
Lee et al.

(10) Patent No.: US 9,422,409 B2
(45) Date of Patent: Aug. 23, 2016

(54) METHOD OF HYDROLYTICALLY STABLE BONDING OF ELASTOMERS TO SUBSTRATES

(75) Inventors: S. Kevin Lee, Cambridge, MA (US); Harry Lee, Boston, MA (US); J. Rajeev Ram, Cambridge, MA (US)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 255 days.

(21) Appl. No.: 13/123,310

(22) PCT Filed: Oct. 9, 2009

(86) PCT No.: PCT/US2009/060107
§ 371 (c)(1),
(2), (4) Date: Apr. 8, 2011

(87) PCT Pub. No.: WO2010/042784
PCT Pub. Date: Apr. 15, 2010

(65) Prior Publication Data
US 2011/0195260 A1    Aug. 11, 2011

Related U.S. Application Data

(60) Provisional application No. 61/104,446, filed on Oct. 10, 2008.

(51) Int. Cl.
*B29C 65/48* (2006.01)
*C08J 5/12* (2006.01)
(Continued)

(52) U.S. Cl.
CPC . *C08J 5/12* (2013.01); *B81C 3/001* (2013.01); *C09J 5/00* (2013.01); *B29C 65/8207* (2013.01); *B29C 65/8223* (2013.01); *B29C 65/8246* (2013.01); *B29C 66/02* (2013.01); *B29C 66/026* (2013.01); *B29C 66/7463* (2013.01); *B29C 66/7465* (2013.01); *B29K 2025/00* (2013.01); *B29K 2033/12* (2013.01); *B29K 2069/00* (2013.01); *B29K 2309/08* (2013.01);
(Continued)

(58) Field of Classification Search
CPC ............ C08J 5/12; B81C 3/001; C09J 5/00
USPC ............ 106/287.13; 156/325, 329; 428/447
See application file for complete search history.

(56) References Cited

U.S. PATENT DOCUMENTS 6,034,171 A * 3/2000 Leempoel ............ 524/730
6,506,314 B1 * 1/2003 Whitney et al. ............ 216/100
(Continued)

FOREIGN PATENT DOCUMENTS

| | | |
|---|---|---|
| JP | 2008-505630 | 2/2008 |
| KR | 10-0437518 | 5/2005 |
| WO | 10-2003-0064737 | 8/2003 |

*Primary Examiner* — Joseph S Del Sole
*Assistant Examiner* — John Robitaille
(74) *Attorney, Agent, or Firm* — Mark Cohen; Pearl Cohen Zedek Latzer Baratz LLP

(57) ABSTRACT

Active devices such as pumps and mixers have been fabricated in plastic-PDMS hybrid devices. By utilizing functionalized bis-silane primers, bond strength between Polycarbonate or PMMA and PDMS improved in dry and aqueous environments. Plastic-primer-PDMS layers exposed to acid and base solutions at 70° C. for 2 hours showed no signs of delamination at 30 psi for pH −1 to 15 and 60 psi for pH 0 to 15. A peristaltic pump fabricated in polycarbonate achieved consistent flow rates up to peristaltic cycle frequencies of 10 Hz in water, 1OM HCl, and 1OM NaOH solutions.

59 Claims, 8 Drawing Sheets

(51) Int. Cl.
  B81C 3/00 (2006.01)
  C09J 5/00 (2006.01)
  B29C 65/82 (2006.01)
  B29C 65/00 (2006.01)
  B29K 25/00 (2006.01)
  B29K 33/00 (2006.01)
  B29K 69/00 (2006.01)
  B29K 309/08 (2006.01)
  B29K 309/10 (2006.01)
  B29L 31/00 (2006.01)

(52) U.S. Cl.
  CPC ....... *B29K2309/10* (2013.01); *B29L 2031/756* (2013.01); *B81B 2201/058* (2013.01); *B81C 2201/019* (2013.01); *C08J 2325/06* (2013.01); *C08J 2333/12* (2013.01); *C08J 2369/00* (2013.01); *C09J 2400/123* (2013.01); *C09J 2400/143* (2013.01); *Y10T 428/31663* (2015.04)

(56) References Cited

U.S. PATENT DOCUMENTS

| | | | |
|---|---|---|---|
| 6,613,439 B1* | 9/2003 | Goebel | 428/429 |
| 2003/0004013 A1* | 1/2003 | Lutz et al. | 473/374 |
| 2004/0198940 A1* | 10/2004 | Wu et al. | 528/28 |
| 2006/0207723 A1* | 9/2006 | Kuhn et al. | 156/329 |

* cited by examiner

Hydrolytic Deposition of Silanes

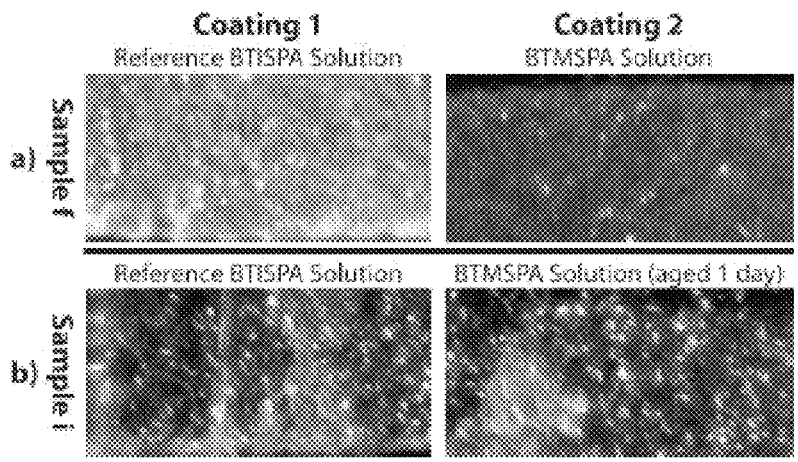

Figure 12

| S | Coating 1 | (end group) | Coating 2 | (end group) | Failure B1 | B2 | C |
|---|---|---|---|---|---|---|---|
| a | BTESPA | (Ethoxy) | BTMSPA | (Methoxy) | | X | |
| b | BTISPA | (Isopropoxy) | PECVD SiO$_2$ | | | X | |
| c | BTISPA | (Isopropoxy) | APTHS | (Hydroxyl) | | X | |
| d | BTISPA | (Isopropoxy) | APTES | (Ethoxy) | | | X |
| e | BTISPA | (Isopropoxy) | BTHSPA | (Hydroxyl) | | X | |
| f | BTISPA | (Isopropoxy) | BTMSPA | (Methoxy) | | X | |
| g | BTISPA | (Isopropoxy) | BTESE | (Ethoxy) | | X | |
| h | BTISPA | (Isopropoxy) | BTESPA | (Ethoxy) | | | X |
| i | BTISPA | (Isopropoxy) | BTISPA | (Isopropxy) | | | X |

End Group Size →

Figure 13

METHOD OF HYDROLYTICALLY STABLE BONDING OF ELASTOMERS TO SUBSTRATES

CROSS-REFERENCE TO RELATED APPLICATIONS

This application is a National Phase Application of PCT International Application No. PCT/US09/060107, International Filing Date Oct. 9, 2009, claiming priority of U.S. Provisional Patent Application, 61/104,446, filed Oct, 10, 2008, all of which are incorporated herein by reference in their entirety.

BACKGROUND OF THE INVENTION

PDMS is a common material for fabrication of microfluidic devices. Elasticity provided by PDMS enables the formation of active devices which can utilize pressurized membranes such as pumps and mixers. However, for microfluidic structures requiring dimensional stability, rigidity, or disposability, PDMS is not the preferred candidate. Such properties are provided by plastics.

Plastics can be manufactured using mass fabrication technologies such as injection molding and hot embossing with well established bonding processes but at the cost of sacrificing active device functionality. Therefore a combination of PDMS and plastics is desirable in the fabrication processes of microfluidic devices in order to gain the advantages of both materials as described above. Fabrication process combining plastic substrates with PDMS membranes enables the formation of active microfluidic devices inside dimensionally stable systems, merging the functionality of PDMS with established plastic fabrication technologies.

Irreversible bonding between PDMS and plastics for fluidics require interfaces which can handle high pressure and harsh chemical environments. Hydrolytic stability under acidic or basic conditions is particularly important for chemical reactions as well as for cell growth. While direct bonding between PMMA and PDMS has been explored, results indicated that direct interfaces only withstood a pressure of approximately 2.5 psi before failure.

To improve bond strength between dissimilar materials, primers are most commonly used. Primers are molecules or films of molecules which are sandwiched between the two dissimilar materials. Such primers comprise at least two functionalities. One function is used to enhance the bond to one material while the other function is used to enhance the bond to the other material. In the case of PDMS bonding to plastics, such primers consist of a silicon-carbon bond, with the carbon atom linked to organic groups such as amide or vinyl groups. These groups provide covalent bonds with organic substrates such as plastics and polymers. Additionally, the silicon atom is bonded to hydrolysable ethyl or methyl groups which can react with other silanols present on the PDMS surface or with metal oxides thus forming inorganic covalent bonds.

Polycarbonate (PC) and polymethylmethacrylate (PMMA) surfaces have been shown to react with amine functional silanes such as AminoPropylTriEthoxySilane (APTES) to form amide bonds on the surface. These silanes then crosslink into a polymer leaving ethyl or methyl groups on the surface. Such silanes were used as primers and have been shown to plasma-bond to PDMS. However, it was found that exposing monolayer primer coatings to plasma bonding processes resulted in degradation of the silane films, leading to DI water induced bond failure and delamination under pressure conditions below 15 psi.

PDMS has greatly reduced the entrance barrier for research in microfluidics based chemistry and biology. The introduction of the elastic microvalve has led to the creation of highly integrated systems capable of automated experimentation, with examples such as whole blood PCR analysis, microbial cell culture, protein crystallization, and multicellular manipulation and analysis, and particle production.

However, for actuated microfluidics to transition from customized prototype devices to industrial scale device production, a transition must be made from elastomers to plastics. Plastics can be manufactured using mass fabrication technologies such as injection molding and hot embossing with well established bonding processes. Plastics are also more dimensionally stable, rigid, and chemically resistant.

Plastics may provide many benefits for microfluidic devices not offered by PDMS. Rigidity enables a variety of reliable external interface options, such as manifold integration, direct barbed tubing connections, and gasket connectors. Additionally, integrating flexible membranes into rigid plastics will enable a variety of new devices currently not possible in PDMS due to chip elasticity such as large area or high pressure membrane deformation, on-chip pressure regulators, full volume pumps, and reliable square channel membrane valve particle filters.

Few technologies exist for bonding PDMS to plastics, notably CVD processes or silane/silicate coatings. Also, data on bond strength in aqueous and chemically harsh environments is not available for the published processes. A bonding process which can demonstrate bonds on low temperature plastics with long term hydrolytic stability is critical for the creation of plastic devices with active membranes. This process would enable active microfluidic devices inside dimensionally stable systems, merging the functionality of PDMS with established plastic mass fabrication technologies.

Bonding Technologies

Bonding between PDMS and plastics for fluidics requires interfaces which can handle high pressure and harsh chemical environments. Typical pressures for total valve closure lie between 5 and 15 psi. Of all possible properties of bond strength, hydrolytic stability is particularly important for reliability since cell growth, chemical synthesis, and protein crystallization, to name a few, all rely on aqueous environments with varying chemistries.

While direct bonding between PMMA and PDMS has been explored, results indicated that interfaces only withstood 2.5 psi before failure. Bond strength can be improved through an intermediate layer, such as a deposited film of glass. Two major methods have been attempted for intermediate layer deposition, direct deposition of glass onto the plastic surface and organo-functional-silane deposition. Direct glass deposition processes are high temperature activated or plasma activated, which can lead to plastic substrate breakdown. In addition, direct glass deposition onto plastic substrates leads to bonds which hydrolyze readily upon exposure to moisture. An intermediate coating containing an inorganic oxide or an organo-functional-silane to improve bond characteristics between organic and inorganic substrates was used. Primer compositions for improving adhesion are sold commercially, with one specifically for Sylgard 184 under the name Dow Corning 92-023 Primer, which contains a titanium alkoxide and allyltrimethoxysilane. However, bond chemistry between this primer and organic surfaces is non-ideal due to oxygen coupled bonds and the lack of long-term hydrolytic stability in aqueous environments, with the majority of the primer consisting of a titanium alkoxide, which readily absorbs water molecules.

More hydrolytically stable silane bonding systems have been explored for plastics, namely APTES to Polycarbonate (PC) and PMMA surfaces to improve the adhesion of sol-gel coatings. It was shown that PC surfaces react with amine groups of AminoPropylTriEthoxySilane (APTES) to form amide bonds on the surface directly. Since amide bonds are hydrolytically stable over a wide pH range, from −1 to greater than 15, amine functional silanes are excellent candidates for surface coatings. Bonding of these coatings to PDMS has also been demonstrated, but hydrolytic stability was not tested. Identifying the processes which cause hydrolytic failure in silane coatings will aid in developing silane compositions and process conditions necessary to ensure hydrolytic resistance.

Silanes and Bond Failure

An overview of silane is needed in order to understand the mechanisms for hydrolysis-induced bond failure. An organofunctional silane is a molecule comprising a silicon atom with at least one bond to carbon to enable organic functionality as shown in FIG. 7. The inorganic side of the silane molecule consists of a silicon atom bound to alkoxy groups through Si—O—C linkages. Commercially, the hydrolytic instability of these bound alkoxy groups allows silanes to hydrolyze in the presence of water, converting the bound alkoxy groups to hydroxyl groups while liberating alcohol molecules. These hydrolyzed silanes can then be used in sol-gel processing, condensing onto hydroxyl containing surfaces or with each other to form substrate bound films. Since the silane matrix looks similar to glass, it is an excellent candidate for plasma bonding to PDMS. In one embodiment, a silane derivative comprises or consists of a silane molecule as described above.

While amine functional silanes have been demonstrated to react directly with certain substrates such as PC and PMMA, prolonged treatment times necessary to generate a reasonable surface bond density as well as substrate selective chemistry make such a process not generally useful. As such, surface activation such as plasma or chemical treatments will be required. In general, these activated organic substrates will contain bound hydroxyl, carboxyl, or other ionic groups which promote hydrogen or ionic bonding of silanes to the organic surface. For activated organic substrates, silane alkoxy group hydrolysis into silanols poses a major problem. While bonding between the silanol group and surface hydroxyl groups is desired for coupling silanes to glass or oxides, bonds formed with organic substrates generate Si—O—C bonds, which are hydrolytically unstable (FIG. 8a). These are the same bonds formed between the silicon molecule and its original alkoxy group, which are meant to hydrolyze readily in water. Any contact with water after bond formation will result in Si—O—C bond hydrolysis and ultimately bond failure. Furthermore, Si—O—C bonds have also been found to form directly between alkoxy groups such as methoxy and surface hydroxyl groups via alcoholysis (FIG. 8b).

In order to achieve hydrolytically stable bonds between silanes and organic surfaces, bonds must be formed through reactions between the organofunctional groups (nitrogen containing) of the silane molecules and the organic surface (FIG. 8c).

In addition to the organic bond between the organofunctional-silane and the organic surface, other processes contribute to bond stability. Hydrolytic bond failure can occur at three locations in the bonding structure, at the PC-silane interface, at the PDMS-silane interface, and in the silane network itself as shown in FIG. 9. While direct interface hydrolysis is unlikely due to the stability of the amide bond, any hydrophilic groups at the interface can act as nucleation sites for water condensation, allowing the silane network near the interface to be plasticized and weakened. A similar process can occur at the PDMS-silane interface but with the possibility of hydrolysis directly at the interface in addition to the weakening of the silane network. For the silane network itself, high crosslink density can provide a major increase in resistance. However, networks formed by typical silanes, containing three silanol groups, tend to be cyclic, decreasing their resistance to dissolution. Addressing failure mechanisms in all three locations is necessary to ensure hydrolytic stability.

SUMMARY OF THE INVENTION

In one embodiment, this invention provides a method of bonding two surfaces, the method comprising:
associating a molecule comprising at least two silane-derivative groups with a first surface;
contacting a second surface to said molecule comprising at least two silane-derivative groups.

In one embodiment, the first surface is rigid and the second surface is flexible. In one embodiment, the rigid surface is the surface of a plastic material. In one embodiment, the plastic material comprises polycarbonate (PC), polymethylmethacrylate (PMMA) or polystyrene (PS).

In one embodiment, before associating a molecule comprising at least two silane-derivative groups with a first surface, a molecule comprising at least one silane-derivative group is applied to the first surface.

In one embodiment, the molecule is deposited from solution onto the first surface thus associating with the surface.

In one embodiment, the two silane-derivative groups in the molecule are hydrolytically stable.

In one embodiment, the hydrolytic stability is achieved by depositing the molecule onto the first surface through immersion of the surface in a solution containing the molecule and optionally containing a chemical which causes hydrolysis of unwanted weak bonds.

In one embodiment, the deposition of the molecule is in the presence of a chemical that prevents hydrolytically unstable bonds from forming at the interface and/or a chemical that breaks unwanted or unstable bonds between the molecule and the surface, allowing more stable bonds to form.

In one embodiment, the molecule associated with the first surface form a 3D crosslinked structure on the first surface. In one embodiment, the thickness of the 3D crosslinked structure ranges between 50 nm and 200 nm.

In one embodiment, the flexible substrate is an elastomer. In one embodiment, after the contacting step, pressure is applied to at least a portion of the first substrate, said second substrate or a combination thereof.

In one embodiment, before or after the associating step, the first surface, said second surface or a combination thereof are plasma-treated or treated chemically and/or mechanically. In one embodiment, after said contacting step, an annealing or a baking or a curing step is performed.

In one embodiment, the elastomer comprises Si. In one embodiment, the Si is in the form of a siloxane. In one embodiment, the siloxane comprises polydimethylsiloxane (PDMS).

In one embodiment, the molecule comprising at least two silane-derivative groups having the formula: $(Y)_m(Z)_{3-m}$—Si—X—Si—$(Y)_m(Z)_{3-m}$ wherein X is a $C_1$-$C_{10}$ branched or unbranched alkyl chain and Y and Z are alkoxy groups.

In one embodiment, Y is an ethoxy group and said Z is a methoxy group. In one embodiment, the molecule is bis(triethoxysilyl)ethane (BTESE).

In one embodiment, the molecule comprising at least two silane-derivative groups is of the formula: $(Y)_m(Z)_{3-m}$—Si—X—R—X—Si—$(Y)_m(Z)_{3-m}$ wherein X is a $C_1$-$C_{10}$ branched or unbranched alkyl chain, Y and Z are alkoxy groups and R is an organic reactive group. In one embodiment, the alkoxy groups are bulky. In one embodiment, the alkoxy groups are isopropanol groups. In one embodiment, the bulky alkoxy groups protect the silane-derivative groups from covalently bonding to the first surface. In one embodiment, the organic reactive group R comprises an amine, an hydroxy group, an ester, phosphate, sulfate, nitro, cyano, vinyl, acrylate, methacrylate or a carboxylic acid group. In one embodiment, the organic reactive group R is covalently-bonded to the surface.

In one embodiment, the molecule comprising at least two silane-derivative groups is Bis(TriMethoxySilylPropyl) Amine (BTMSPA), Bis(TrilsopropylSilylPropyl)Amine (BTISPA) or a combination thereof.

In one embodiment, the molecule comprising one silane-derivative group is of the formula: R—X—Si—$(Y)_m(Z)_{3-m}$ wherein X is a $C_1$-$C_{10}$ branched or unbranched alkyl chain, Y and Z are an alkoxy group and R is an organic reactive group.

In one embodiment, the organic reactive group R comprises an amine, an hydroxy group, an ester, phosphate, sulfate, nitro, cyano, vinyl, acrylate, methacrylate or a carboxylic acid group. In one embodiment, the organic reactive group is covalently-bonded to the first surface. In one embodiment, the molecule comprising one silane-derivative group is aminopropyl triethoxysilane (APTES).

In one embodiment, the solvent of the solution from which the molecule comprising the two silane derivative groups is deposited comprises isopropanol. In one embodiment, the solution comprises a cure catalyst. In one embodiment, the concentration of the catalyst in the solution ranges between 0.05 wt % and 0.5 wt %. In one embodiment, the cure catalyst is titanium alkoxide (TA). In one embodiment, the ratio between the molecule comprising at least two silane-derivative groups and between the cure catalyst is greater than 1:1.

In one embodiment, the solution comprises between 1 wt % to 10 wt % of the molecule comprising at least two silane-derivative groups.

In one embodiment, this invention provides an elastomer-primer-surface structure prepared by bonding two surfaces by a method comprising:
 associating a molecule comprising at least two silane-derivative groups with a first surface;
 contacting a second surface to said molecule comprising at least two silane-derivative groups.

In one embodiment, the primer in the elastomer-primer-surface structure is in contact with the elastomer, the first surface or a combination thereof. In one embodiment, the primer comprises a molecule comprising at least two silane-derivative groups. In one embodiment, the structure is stable against aqueous solutions in a pH range between −1 and 15. In one embodiment, the structure is stable when in contact with an organic solvent. In one embodiment, the structure is stable under a pressure of up to 200 psi. In one embodiment pH −1 correspond to an $H^+$ concentration of 10 M. In one embodiment, pH 15 corresponds to an $OH^-$ concentration of 10 M.

In one embodiment, this invention provides a microfluidic device comprising an elastomer-primer-surface structure. In one embodiment, the microfluidic device comprising at least two such structures such that the two structures are bonded by the molecule comprising at least two silane-derivative groups. In one embodiment, the microfluidic device further comprises a peristaltic pump. In one embodiment, the peristaltic pump achieves consistent flow rates up to peristaltic cycle frequencies of 10 Hz in water, in up to 10 M HCl solution or in up to 10 M NaOH solution.

In one embodiment, this invention provides a micro total analysis system (μ-TAS) comprising a microfluidic device as described above.

In one embodiment, this invention provides a composition comprising a molecule comprising at least two silane-derivative groups. In one embodiment, the composition further comprises a solvent, a cure catalyst, a molecule comprising one silane-derivative group or a combination thereof. In one embodiment, the ratio of the molecule comprising at least two silane-derivative groups to the molecule comprising one silane-derivative group in the composition is greater than 1:1.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

FIG. 12 illustrates: (a) A peel test (Table If in FIG. 13) between newly mixed BTMSPA in isopropanol and a reference solution of BTISPA (BTMSPA aged for 2 weeks). The BTMSPA layer is completely removed from the bottom PC surface and bonded to the PDMS giving a rainbow appearance, (b) A peel test (Table 1i in FIG. 13) with the same BTMSPA solution in isopropanol aged for 1 day and the reference BTISPA solution. Aging the BTISPA solution for 1 day results in greatly improved bond strength. Peel tests result in cohesive failure and PDMS bonded on both PC sides.

FIG. 13 is a summary of bond failures for differential peel tests. S is the sample type, B1 is bond 1 failure, B2 is bond 2 failure, and C is cohesive failure as given in FIG. 11a. Stronger coatings are listed as coating 1 and the weaker coating as coating 2. Delamination at bond 2 is apparent for all coatings with small end groups on the silane molecule. Failure at bond 2 for BTESE for sample (g) and success for sample (h) shows that bond strength is contributed by the amine functional group.

Figure 1:
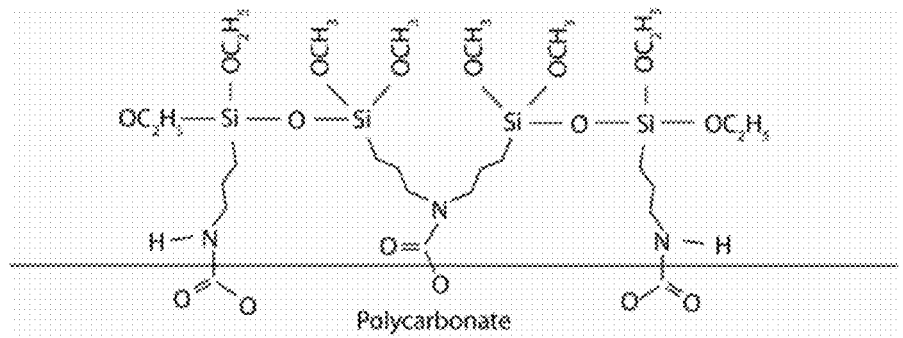
FIG. 1 is a schematic of one embodiment of a possible configuration at the PC-Primer interface showing covalent bonds to the substrate and surface groups.

It will be appreciated that for simplicity and clarity of illustration, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those skilled in the art that the present invention may be practiced without these specific details. In other instances, well-known methods, procedures, and components have not been described in detail so as not to obscure the present invention.

In one embodiment, the application of organo functional silanes for bonding plastic substrates to PDMS membranes is explored in methods of this invention. Such devices may enable actuated membrane microfluidics in plastic devices.

Bond strength degradation in aqueous environments can be reduced by using bis-silanes with larger alkoxy end groups to promote organofunctional bond formation with the plastic substrate. Hydrolytic failure can also result from low silane crosslink density or interface hydrophilicity. In one embodiment, a test device consisting of three-valve peristaltic pumps is fabricated out of polycarbonate (PC) and bonded to PDMS through isopropoxy modified Bis-Trimethoxy-Silyl-Propyl-Amine Valves of the device were operated up to 60 psi in aqueous environments without failure. Solutions of DI water and 1 M HCl were also pumped through the device via peristaltic actuation at 18 psi for 2 weeks without bond failure. 1M NaOH was also tested and resulted in bond failure after 115 hours.

Figure 8:
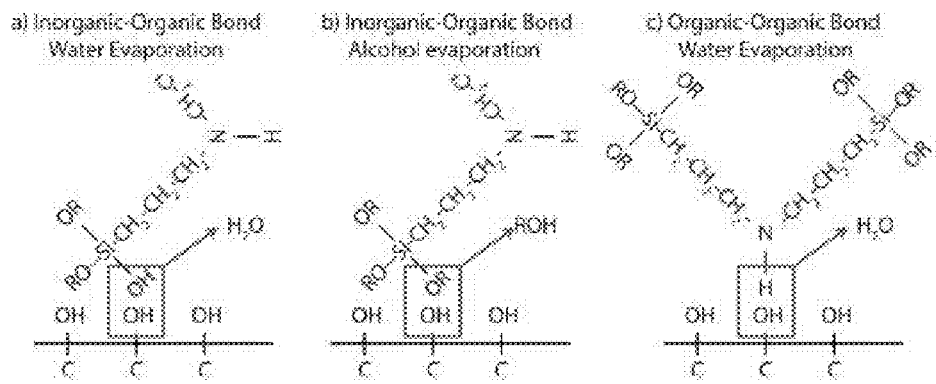
FIG. 8 illustrates different methods of bond formation between organofunctional silanes and organic substrates. Inorganic-organic bond formation can occur through water (a) or alcohol (b) evaporation, generating Si—O—C bonds. Organic-organic bond formation can also occur through water evaporation (c).
Figure 9:
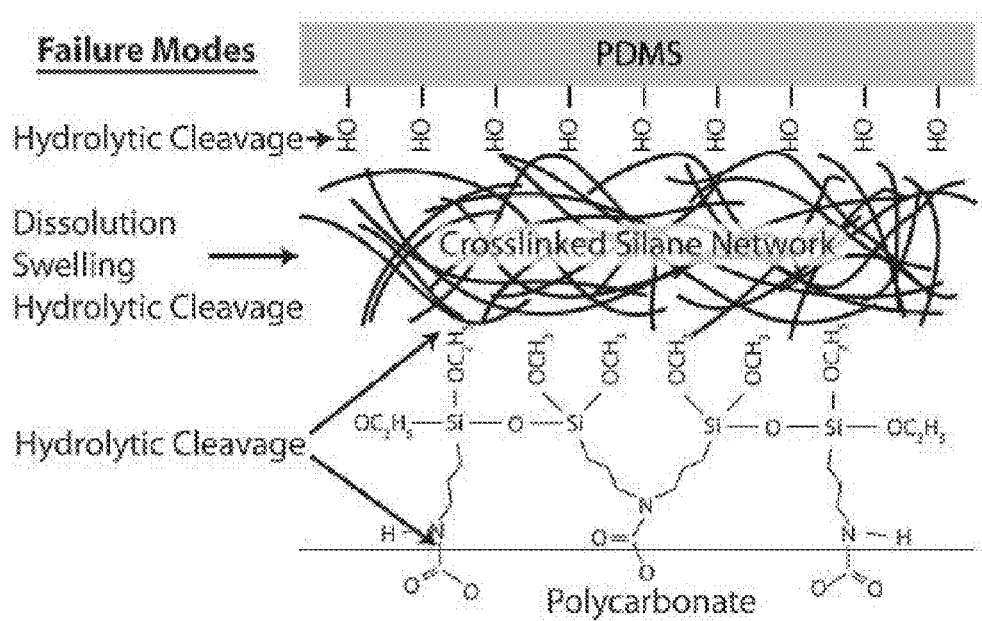
FIG. 9 illustrates different bond failure mechanisms for silane bonding between organic substrates and PDMS. The PDMS-silane interface, the PC-silane interface, and the silane network are all vulnerable to hydrolysis.

In one embodiment, In order to achieve hydrolytically stable bonds between silanes and organic surfaces, bonds must be formed through reactions between the organofunctional groups (nitrogen containing) of the silane molecules and the organic surface (FIG. 8c). Two bonding experiments described herein below will show that this bond mechanism can be increased by attaching sterically bulky groups to the silicon atom, inhibiting alcoholysis and hydrolysis.

In one embodiment, this invention describes the use of a bis-organo-silane as an intermediate primer layer in the process of bonding organic substrates, such as plastics (polycarbonate, PMMA, polystyrene), to silicon-containing substrates such as PDMS, glass, or Si, to greatly improve the hydrolytic stability of the bond when exposed to aqueous, acidic, basic, or solvent containing environments.

In one embodiment, if a bis-organo-silane does not exist with the appropriate organic surface-anchoring group, a mixture containing a bis-silane and an appropriate primer is used. In one embodiment, the appropriate primer comprises an organically reactive molecule bearing one silane-derivative group that can anchor to the surface. In one embodiment, a mixture is prepared containing a molecule comprising one silane-derivative group and containing a molecule comprising two silane-derivative groups. In one embodiment, such mixture has concentration or weight ratio of greater than 1:1 bis-silane:uni-silane and usually greater than 10:1 of bis-silane to uni-silanes. A mixture with such concentration or weight ratio greatly improves hydrolysis resistance of substrate/primer/elastomer bond interfaces.

In one embodiment, the uni-silane molecule is applied first to the surface as a primer, and the bis-silane is added subsequently. In another embodiment, a uni-silane and a bis-silane are mixed and are applied to the surface from the mixture together. In one embodiment, the addition of the bis silane in a mixture with the uni-silane or consequently, generates cross linking between uni-silane (primer) molecules and/or between surface functional groups and primer functional groups. One embodiment of such cross-linking is described in FIG. 1. In one embodiment, bis silane molecules cross link with one another to generate a branched/cross linked organosilane structure on the surface.

In one embodiment, substrates or surfaces of this invention can be organic or inorganic. In one embodiment, substrates or surfaces of the invention may contain inorganic and organic groups, inorganic and organic materials, or hybrid inorganic/organic structures. In one embodiment substrate and surface are interchangeable terms.

In one embodiment, use of sterically-hindered organo-uni-silanes or organo-bis-silanes, bearing or lacking an additional non-silaneous organic functional group as a primer layer improves hydrolytic stability of bonds at the organic substrate-primer interface as well as at the primer-PDMS interface, when a silane-containing molecule is used as a surface coating or primer. Specifically, sterically hindered isopropyl alkoxy groups bonded to silicon atoms in a primer molecule allow selective binding of the non-silaneous organic functional group of the primer molecule to the organic substrate, even after hydroxyl modification of the organic substrate. In one embodiment, such non-silaneous organic functional group is an amine, as depicted in FIG. 1.

In one embodiment, bonding to the surface through a non-silaneous group on the primer molecule is advantageous over unstable C—O—Si bond formation between the primer molecule and the surface. Such binding is in contrast to existing techniques in which the primer bond to the oxide-containing substrate is achieved through Z—O—Si bonding, wherein Z is the oxide containing substrate. Such Z—O—Si primer/surface bond is not highly hydrolytically stable.

In addition, any C—O—Si bond formation comprising a Si atom on the primer molecule will be protected by neighboring sterically hindering (e.g. Isopropyl) groups to improve its bond stability to hydrolysis.

In one embodiment, use of sterically hindered silanes thus specifically allows the non-silaneous organically reactive side of the organo-silane to bond to the organic substrate, even after hydroxyl activation of the organic substrate.

In one embodiment, this invention provides an improved stability of the surface-elastomer bond. In one embodiment, to further improve interface stability toward hydrolysis, any hydrophilic groups introduced during the bonding process as a result of chemical modification or plasma activation that do not contribute to bonding can be removed after interface bonding. In one embodiment, the first surface, the second surface, the primer or a combination thereof are made of a polymer. In one embodiment, hydrophilic groups on the polymer may cause hydrolytic instability at the interface. In one embodiment, the hydrophilic groups are mobile above a certain temperature, and are able to migrate from the interface of the polymer into the bulk. In one embodiment, such migration that removes or reduces hydrophilic bonds at the interfaces is a thermally induced diffusion process. In one embodiment, the substrate, primer, and elastomer are all polymers, and heating allows for a mild degree of mobility of the polymer chains. This allows any hydrophilically modified polymer chains at the interface to redistribute into the bulk material. According to this aspect and in one embodiment such hydrophilic groups are removed from the interface, and into the bulk material.

In one embodiment, the interface is referred to the area between each surface and the primer, or to the total area between the two surfaces or a combination thereof. In one embodiment, heating is part of the annealing/baking/curing processes described herein below.

In one embodiment, at the substrate side, especially if the substrate is made of an organic material, improved stability can be accomplished by annealing the substrate coated by the primer layer such that any originally introduced hydrophilic groups on the polymers can diffuse away from the interface and into the bulk of the polymer.

In one embodiment, when the first surface is a plastic, the temperature is elevated to near the melting point of the plastic for reasonable diffusion speeds, similar to stress relief by high temperature annealing since chain mobility in plastics is highly restricted. Similar diffusion processes occur with the elastomer and primer in one embodiment since these are also crosslinked polymers and hydrophilic groups on their surfaces can diffuse into the bulk In one embodiment, a less hydrophilic surface is more hydrolytically stable.

In one embodiment, at the primer/elastomer interface, annealing of the elastomer can also promote diffusion away of undesired groups from the interface and into the bulk. In one embodiment, for the primer itself, bonding between the elastomer and primer can be performed before the primer is fully cured, such that introduced hydrophilic groups that do not result in covalent bonds at the primer-elastomer interface can also be removed by diffusion or by further crosslinking.

In one embodiment, this invention provides a method for use of a bis-silane in a bonding process for the creation of reliable passive and active fluidic devices either in the micro- or macro-scale. Such devices utilize the combination of rigid substrates for robustness with flexible polymer membranes for actuation.

In one embodiment, this invention provides hydrolytically stable bonding between rigid substrates and flexible polymers using bis-silane-derivative molecules in a multi-step priming process or as an ingredient in a primer composition. In one embodiment, the silane moieties of the present invention comprise sterically hindering, bulky alkoxy groups that protect the silanes from undesired hydrolysis and from undesired reactions.

In one embodiment, this invention provides a method of bonding two surfaces, the method comprising:
  associating a molecule comprising at least two silane-derivative groups with a first surface;
  contacting a second surface to said molecule comprising at least two silane-derivative groups.

In one embodiment, the first surface is rigid and the second surface is flexible. In one embodiment, the rigid surface is the surface of a plastic material. In one embodiment, the plastic comprises polycarbonate (PC), polymethylmethacrylate (PMMA) or polystyrene (PS). In one embodiment, the rigid surface comprises mica, glass or metal oxide. In one embodiment, before associating a molecule comprising at least two silane-derivative groups with a first surface, a molecule comprising at least one silane-derivative group is applied to the first surface.

In one embodiment, associating with a surface means creating a chemical bond with the surface. In one embodiment, the chemical bond is covalent. In one embodiment, the chemical bond is a polar bond. In one embodiment, the chemical bond is a van-der-Waals bond. In one embodiment, associating with a surface comprises a mediator. In one embodiment, the mediator is an additional molecule. In one embodiment, associating the molecule with the surface comprises a chemical bond or bonds between the molecule and the mediator and chemical bond or bonds between the mediator and the surface. In one embodiment, associating the molecule with the surface comprises forming bonds between the molecule and the surface, between the molecule and the mediator or a combination thereof. In one embodiment, the mediator forms an incomplete monolayer on the surface and the molecule bonds to the mediator or to the surface in voids within the monolayers. In one embodiment, the bis-silane derivative containing molecule is bonded on top of the mediator layer. In one embodiment, the molecule forms a layer or a film on top of the mediator layer or on top of the surface itself. In one embodiment, the molecular film is one molecule thick. In one embodiment, the molecular film is more than one molecule thick. In one embodiment, the molecular film is cross linked. In one embodiment, cross-linking is provided by Si—O—Si bonds. In one embodiment, cross linking is provided by Si—O—C bonds. In one embodiment, the film thickness is in the nanometer range. In one embodiment, the molecular film thickness is in the micrometer range. In one embodiment, the micrometer range is between 1 micrometer and 1000 micrometers.

In one embodiment, a silane-derivative group comprises any group containing a Si atom covalently-bonded to four other chemical groups. In one embodiment, a silane derivative of this invention comprises a Si atom which makes one bond through a carbon atom (C) to an organic moiety and that makes three other bonds to three oxygen atoms. In one embodiment, the Si—O bonds are further bonded to an alkyl group, thus forming a Si-alkoxy bond. In one embodiment, if the molecule comprising a silicon-derivative further comprises an organic group, the molecule is referred to as an organo-silane. In one embodiment, the term silane used in this invention is in the broad sense, meaning that any four groups can be bonded to the Si atom and not just four hydrogen atoms as in the narrow or historical definition of a silane. In one embodiment, a silane bonded to alkoxy groups, to carbon, to hydroxyl groups and/or to other chemical groups other than a hydrogen can be viewed as a $SiH_4$ molecule that underwent exchange of the H atoms with other functional groups, and is yet referred to as a "silane".

In one embodiment a surface is a surface of a material. In one embodiment a "surface" is synonymous with a "substrate". In one embodiment, the surface is smooth. In another embodiment, the surface is rough. In one embodiment, the surface may comprise smooth and rough regions.

In one embodiment, the first surface is made of a rigid material. In one embodiment the surface thickness is in the micrometer range. In one embodiment, the surface thickness is in the mm range. In one embodiment, the surface thickness is in the cm range. In one embodiment, the surface is transparent. In one embodiment the surface is opaque. In one embodiment, the surface is the surface of a metal-oxide. In one embodiment, the metal in the metal oxide comprises titanium, indium, indium/tin or aluminum. In one embodiment the surface comprises a metal. In one embodiment, the metal is gold, silver, palladium, platinum, gold/palladium. In one embodiment, the metal or metal oxide surface comprises tungsten. In one embodiment, the surface comprises GaAs, GaN, AlGaAs, CdS or CdSe.

In one embodiment, the surface comprises plastic. In one embodiment, plastic comprises synthetic or semi synthetic organic solid materials suitable for the manufacture of industrial products. In one embodiment, plastics are polymers of high molecular weight, and may contain other substances to improve performance. In one embodiment, plastics are materials that can be molded. In one embodiment, plastics are malleable or possess plasticity during manufacture. In one embodiment, plastics can be cast, pressed, or extruded into a variety of shapes—such as films, fibers, plates, tubes, bottles or boxes.

In one embodiment, plastic is any material that undergoes a permanent change of shape (a "plastic deformation") when strained beyond a certain point.

In one embodiment, plastics can be classified by their chemical structure. In one embodiment, plastics are polymers comprising acrylics, polyesters, silicones, polyurethanes, and halogenated units. In one embodiment, plastics can be synthesized by condensation, polyaddition, cross-linking or a combination thereof.

In one embodiment, plastics are defined by their physical, structural and chemical properties such as thermoplasticity and thermosetic property, biodegradability or electrical conductance. In one embodiment plastics used in this invention vary in their density, tensile strength, glass transition temperature and resistance to various chemical.

In one embodiment, the average molecular weight of the polymers comprising the plastics ranges between 20,000 to 500,000 in molecular mass units. In some embodiments, polymers comprising the plastics of this invention have a much larger molecular weight.

In one embodiment, plastics of this invention are crystalline or partially crystalline. In one embodiment, plastics are amorphous.

In one embodiment, plastics comprises polymers such as polyethylene, polypropylene, poly (vinyl chloride), polyamides (nylons), polyesters, polyurethanes, polystyrene and its copolymers, poly acrylic acid, poly (methyl methacrylate) or polycarbonates.

In one embodiment, plastics comprise bakelite or polyethylene terephthalate. In one embodiment, the plastics are cross linked. In one embodiment the plastics contain additives. In one embodiment the plastics are cured. In one embodiment, the polymers in the plastic are vulcanized. In one embodiment, vulcanization comprises addition of sulfur atoms.

In one embodiment, the associating step comprises evaporating the molecule comprising at least two silane-derivative groups onto the first surface. In one embodiment, evaporating comprising heating a solid or a liquid form of the molecules until some amount of molecules evaporates or goes into a gas phase. In one embodiment, molecules in the gas phase that are brought into contact with a surface, will deposit on the surface or stick to the surface.

In one embodiment, the associating step comprises depositing the molecule from solution onto the first surface. In one embodiment, the molecules are dissolved in the solution, and when the molecules are brought into contact with a surface, the molecules will deposit on or stick to the surface. In one embodiment, dipping a surface in a solution comprising the molecules allows molecules from solution to get in contact with the surface and deposit on it. In one embodiment wiping the surface with a solution containing the molecules achieves the desired initial contact between the molecules and the surface that leads to deposition of the molecules on the surface. In one embodiment, deposition of molecules onto the surface is accomplished by self-assembly. In one embodiment, self-assembly describes the spontaneous bonding of molecules from solution onto a surface. In one embodiment, deposition on a surface means bonding with, associating with, precipitation onto, bringing into contact with the surface. In one embodiment, depositing comprises processes of spraying, sprinkling, wetting, dipping, wiping, spin-coating, flowing and vapor introduction. In one embodiment, spin-coating involves placing the surface on a rotating holder, applying a drop of solution to the surface, and spinning the surface to remove the solution. In one embodiment, in the spin-coating process, some molecules remain attached to the surface. In one embodiment, a monolayer, a partial monolayers or a thicker film is formed on the surface as a result of the processes described above. In one embodiment, wiping comprises wetting a cotton swab/cloth/sponge with the solution and "wiping" the moist cloth onto the substrate to deposit the solution. In one embodiment, the advantage of wiping is that it can be done selectively on portions of the substrate/surface rather than conformally over the entire material.

In one embodiment, the molecule is deposited from a melt. In one embodiment, a melt is a liquid form of the pure molecule. In one embodiment, deposition from a melt has the advantage of having small amount of impurities. In one embodiment, deposition from the melt leads to a highly controlled molecular film thickness.

In one embodiment, the silane-derivative groups of the molecule are hydrolytically stable.

In another embodiment, the bonds between the molecule comprising two silane-derivative groups and the first surface or the second surface are hydrolytically stable. In one embodiment, hydrolytic stability of the bonds between the molecule and the surface is achieved by depositing the molecule onto the first surface through immersion of the surface in a solution containing the molecule and a chemical which causes hydrolysis. In one embodiment, the molecule can bond to the surface in two ways: either through the organic functional group (R) or through the Si—O— group. The organic group (R) bonding to the substrate (e.g. an amide bond) is hydrolytically stable and preferred, where an inorganic bond (e.g. Si—O-surface) bond is not hydrolytically stable and unwanted.

In one embodiment, since the molecule can bond both ways, reducing unwanted Si—O-surface bonds is desired. In one embodiment, this is done by mixing a protic solvent which comprises small molecules with the primer. Such solvent can diffuse easily to the interface of the molecule and the surface. In one embodiment, the solvent comprises methanol, ethanol, isopropanol or water. These chemicals can then attack the Si—O-substrate bonds and break them, re-dissolving this part of the molecule. Since the likelihood of attack on an amide bond is much lower, only or mostly hydrolytically stable amide bonds are retained at the interface.

Figure 6:
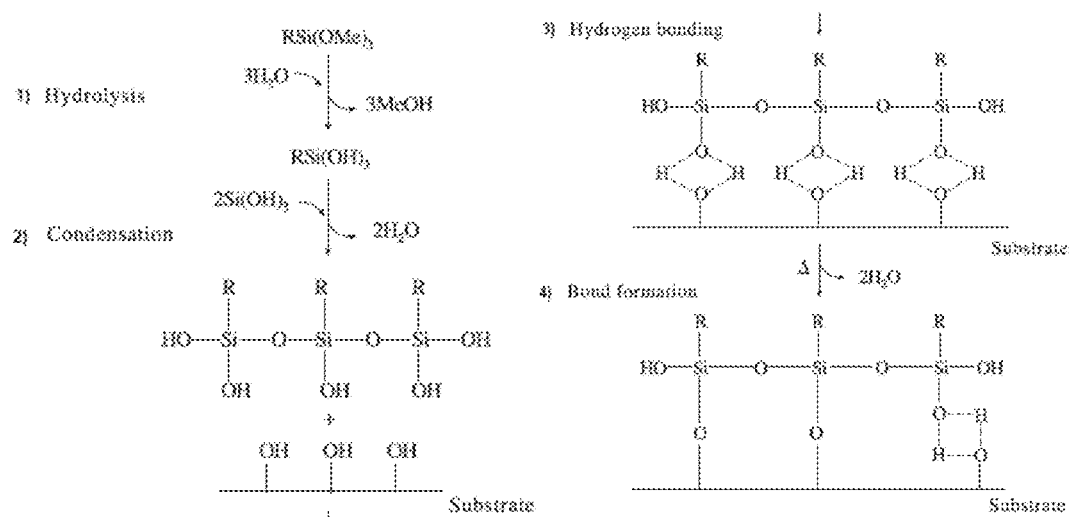
FIG. 6 is a scheme showing hydrolytic deposition of silanes.
Figure 7:
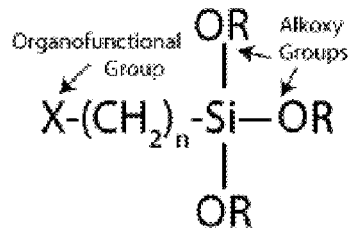
FIG. 7 illustrates chemical structure of a typical silane molecule. A carbon-silicon bond allows organic functional groups to be covalently linked to silicon.

In one embodiment, deposition from a solution containing the molecule and a chemical which causes hydrolysis prevents hydrolytically unstable bonds from forming at the interface. According to this aspect and in one embodiment, the molecule containing two silane-derivative groups, further contains an R group (e.g. an amine) as illustrated in FIG. 1. The preferred bonding between the molecule and the substrate is through the amine Such bond (e.g. an amide bond) is hydrolytically stable. However, the silane-derivative groups on the molecule might also form bonds to the substrate (surface) as described in FIG. 6. Such bonds involving e.g. a Si—O— bond are not hydrolytically stable, and therefore are undesired. Thus, in order to achieve bonding of the molecule to the surface through the R group, a chemical is added such that it can hydrolyze unwanted bonds between the Si moieties on the molecule and the surface. Since this added chemical constantly breaks such bonds, and since the R-surface bonds (e.g. amide bond) is not affected by this chemical, bonding through the R group of the molecule to the surface predominates in one embodiment. This type of bonding is much less susceptible to hydrolysis and it renders the surface/primer/elastomer structure hydrolytically stable.

In one embodiment, the chemical that causes hydrolysis of unwanted bonds is a protic solvent. In one embodiment, the protic solvent is isopropanol, ethanol or methanol. In one embodiment, the solvent is water.

In one embodiment, the chemical that causes hydrolysis of unwanted molecule-surface bonds is a small molecule. In one embodiment, the role of the chemical is to diffuse into the interface between the molecule and the surface and re-hydrolyze or re-dissolve any Si—O—C covalent bonds or Si—O—H—H—O—C hydrogen bonds (see FIG. 6) between the primer molecule and the substrate into Si-alkoxy bonds, while not affecting any organic-substrate bonds between the organic functional group R of the silane-derivative containing molecule and the substrate.

In one embodiment, deposition time ranges from 30 minutes to 2 hours. In one embodiment, depositing from the solution comprises dip-coating or spin-coating the first surface by the solution, or spraying or wiping the first surface with said solution. In one embodiment, the associating step comprises depositing the molecule from a melt. In one embodiment, the molecule associated with the first surface form a 3D crosslinked structure on the first surface. In one embodiment, the thickness of the 3D crosslinked structure ranges between 50 nm and 200 nm In one embodiment, the 3D crosslinked structure is 100 nm thick. In one embodiment, the thickness of said 3D crosslinked structure ranges between 100 nm and 1000 nm.

In one embodiment, the flexible substrate is an elastomer.

In one embodiment elastomer is an elastic polymer. In one embodiment, elastomers are amorphous polymers existing above their glass transition temperature, so that considerable segmental motion is possible. In one embodiment, at ambient temperatures elastomers (sometimes referred to as rubbers) are relatively soft and deformable. In one embodiment, elastomers are easily molded and are flexible.

In one embodiment, elastomers comprises rubber, nitrile containing polymers, polybutadiene, acrylonitrile, hydrogenated polymers, polyacrylic polymers, silicon elastomers, fluorinated silicon elastomers, polyurethane, natural protein-containing polymers or polysulfides. In one embodiment, the elastomer comprises block copolymers.

In one embodiment, the silicon elastomer comprises a siloxane polymer. In one embodiment, a siloxane unit comprises a silicon atom bonded to two oxygen atoms and further bonded to two R groups. In one embodiment, the R group is a hydrocarbon. In one embodiment, the two R groups are the same. In one embodiment, the two R groups are different. In one embodiment at least one of the two R groups is a methyl group. In one embodiment the R group is an ethyl group. In one embodiment, the R group is a phenyl group. In one embodiment, the siloxane polymer comprises polydimethyl siloxane (PDMS). In one embodiment, PDMS is a polymer comprising siloxane units in which the R groups are methyl groups as described herein above.

In one embodiment, after the contacting step, pressure is applied to at least a portion of the first substrate, the second substrate or a combination thereof.

In one embodiment, before or after the associating step, the first surface, the second surface or a combination thereof are treated. In one embodiment, the treating step comprises plasma treatment. In one embodiment, plasma treatment comprises treating the surface with ions. In one embodiment, plasma treatment involves treatment of the surface with oxygen ions or with oxygen atoms. In one embodiment, during plasma treatment, oxygen atoms or ions interact or react with surface atoms. In one embodiment, such reaction modifies surface groups. In one embodiment, such treatment results in oxidation of surface groups. In one embodiment, plasma treatment results in the generation of hydroxyl groups or carboxylic groups on the surface. In one embodiment, plasma treatment is conducted under reduced pressure.

In one embodiment, the treating step comprises chemical treatment, mechanical treatment or a combination thereof. In one embodiment, chemical treatment comprises a reaction between surface chemical groups and other chemicals introduced from the gas phase, from solution or as pure chemicals in a liquid form.

In one embodiment, mechanical treatment of a surface comprises, wiping, polishing, pressing, molding, applying vacuum, scratching or smoothing the surface.

In one embodiment, after the contacting step, an annealing or a baking or a curing step is performed. In one embodiment, the annealing or baking or curing step enhances the bonding between the first substrate and the molecule, between the second substrate and the molecule or a combination thereof. In one embodiment, baking, curing and annealing are synonymous. In one embodiment, baking, annealing or curing comprises placing an object to be baked/annealed/cured in an oven, or under elevated temperatures. In one embodiment, the baking/annealing/curing process comprises chemical reactions. In one embodiment, the baking/annealing/curing process comprises cross-linking within the primer layer or the formation of chemical bonds between the primer layer and the surfaces of this invention. In one embodiment, the baking/annealing/curing process degases the object undergoing the process. In on embodiment, degassing involves the elimination of atoms, ions or molecules from the object(s) undergoing the process. In one embodiment, the annealing or the baking or the curing is conducted at a temperature ranging between 50° c and 200° c. In one embodiment, the annealing or the baking or the curing is conducted at 70° c. In one embodiment, the annealing or the baking or the curing is conducted at 105° c.

In one embodiment, the annealing or the baking or the curing is conducted for a period ranging between 20 h to 30 h. In one embodiment, the annealing or the baking or the curing is conducted for a period ranging between 0.5 h to 3 h. In one embodiment, the annealing is conducted under dry conditions, under wet conditions or a combination thereof.

In one embodiment, the elastomer comprises Si. In one embodiment, the Si is in the form of a siloxane. In one embodiment, the siloxane comprises polydimethylsiloxane (PDMS). In one embodiment, the thickness of the PDMS ranges between 10 μm and 200 μm. In one embodiment, the thickness of the PDMS is approximately 70 μm.

In one embodiment, the molecule comprising at least two silane-derivative groups is of the formula: $(Y)_m(Z)_{3-m}$—Si—X—Si—$(Y)_m(Z)_{3-m}$ wherein X is a $C_1$-$C_{10}$ branched or unbranched alkyl chain and Y and Z are alkoxy groups.

In one embodiment, Y is an ethoxy group and Z is a methoxy group. In one embodiment, the molecule comprising at least two silane-derivative groups is bis(triethoxysilyl)ethane (BTESE).

In one embodiment, the molecule comprising at least two silane-derivative groups is of the formula: $(Y)_m(Z)_{3-m}$—Si—X—R—X—Si—$(Y)_m(Z)_{3-m}$ wherein X is a $C_1$-$C_{10}$ branched or unbranched alkyl chain, Y and Z are alkoxy groups and R is an organic reactive group.

In one embodiment, at least some of the alkoxy groups are bulky alkoxy groups. In one embodiment, the bulky alkoxy groups are isopropanol groups. In one embodiment, the bulky alkoxy groups protect said silane-derivative groups from covalently bonding to the first surface.

In one embodiment, Y is an isopropyl alkoxy group and Z is a methoxy group. In one embodiment, the organic reactive group R comprises an amine, an hydroxy group, an ester, phosphate, sulfate, nitro, cyano, vinyl, acrylate, methacrylate or a carboxylic acid group. In one embodiment, the organic reactive group R is covalently-bonded to the surface. In one embodiment, the molecule comprising at least two silane-derivative groups is Bis(TriMethoxySilylPropyl)Amine (BTMSPA), Bis(TriIsopropylSilylPropyl)Amine (BTISPA) or a combination thereof.

In one embodiment, the molecule comprising at least one silane-derivative group is of the formula: R—X—Si—$(Y)_m(Z)_{3-m}$ wherein X is a $C_1$-$C_{10}$ branched or unbranched alkyl chain, Y and Z are an alkoxy group and R is an organic reactive group.

In one embodiment, the organic reactive group R comprises an amine, an hydroxy group, an ester, phosphate, sulfate, nitro, cyano, vinyl, acrylate, methacrylate or a carboxylic acid group. In one embodiment, the organic reactive group is covalently-bonded to said surface. In one embodiment, Y is an isopropyl alkoxy group and Z is a methoxy or an ethoxy group. In one embodiment, the molecule comprising at least one silane-derivative group is aminopropyl triethoxysilane (APTES).

In one embodiment, the solvent of the solution from which a molecule comprising two silane-derivative groups is deposited on the surface, comprises isopropanol.

In one embodiment, the solution comprises a cure catalyst. In one embodiment, the catalyst is used to catalyze cross-linking within the primer layer. In one embodiment, the catalyst is used to cure the primer layer. In one embodiment, the concentration of the catalyst in the solution ranges between 0.05 wt % and 0.5 wt %. In one embodiment, the concentration of the catalyst in the solution is 0.2 wt %. In one embodiment, the catalyst is a moisture cure catalyst. In one embodiment, the moisture cure catalyst is titanium alkoxide (TA).

In one embodiment, the ratio between the molecule comprising at least two silane-derivative groups and between the cure catalyst in the solution ranges between 0.9:1 and 1.1:1. In one embodiment, the ratio between the molecule comprising at least two silane-derivative groups and between the cure catalyst is greater than 1:1. In one embodiment, the ratio between said molecule comprising at least two silane-derivative groups and between said cure catalyst ranges between 9:1 and 11:1. In one embodiment, the ratio between said molecule comprising at least two silane-derivative groups and between said cure catalyst ranges between 2:1 and 8:1.

In one embodiment, the solution comprises between 1 wt % to 10 wt % of the molecule comprising at least two silane-derivative groups. In one embodiment, the solution comprises approximately 5 wt % of said molecule comprising at least two silane-derivative groups.

In one embodiment, this invention provides an elastomer-primer-surface structure prepared by bonding two surfaces by a method comprising:

associating a molecule comprising at least two silane-derivative groups with a first surface;

contacting a second surface to said molecule comprising at least two silane-derivative groups.

In one embodiment, the term primer as used herein comprises a molecule bearing a uni-silane-derivative group. In another embodiment, the term primer as used herein comprises a molecule bearing a bis-silane-derivative group. In another embodiment, the term primer as used herein comprises both a molecule bearing a uni-silane-derivative group and a molecule bearing a bis-silane-derivative group. In one embodiment, the term primer as used herein further comprises a catalyst, chemical additives, and/or solvent or solvent traces. In one embodiment, the primer forms a monolayer. In one embodiment, the primer is a film. In one embodiment, the primer is a combination of at least two layers. In one embodiments the at least two layers comprises similar derivatives. In one embodiment the at least two layers comprise different materials. In one embodiment, the primer comprises pure monolayers. In one embodiment, the primer comprises mixed monolayers. In one embodiment, the primer comprises thick coating on top of pure or mixed monolayers as described herein above. In one embodiment, a molecule bearing a bis-silane derivative is a molecule bearing two silane derivatives.

In one embodiment, the primer is in contact with the elastomer, the surface or a combination thereof. In one embodiment, the primer comprises a molecule comprising at least two silane-derivative groups.

In one embodiment, the structure is stable against aqueous solutions in a pH range between −1 and 15. In one embodiment, the structure is stable against aqueous solutions in a pH range between 0 and 15. In one embodiment, the structure is stable when in contact with an organic solvent. In one embodiment, the organic solvent is protic solvent.

In one embodiment, the structure is stable under a pressure of up to 200 psi. In one embodiment, the structure is stable under a pressure of up to 100 psi. In one embodiment, the structure is stable under a pressure of up to 60 psi. In one embodiment, the structure is stable under a pressure ranging between 20 psi and 200 psi. In one embodiment, psi is a unit of pressure. In one embodiment psi definition is: "pound per square inch". In one embodiment, 14.696 psi equals 1 atm in pressure units. In one embodiment the structure is stable in a wet environment at a pressure ranging between 1 psi and 100 psi. In one embodiment, the structure is stable in a wet environment under any pressure greater than 60 psi. In one embodiment, the structure is stable in a wet environment under a pressure ranging between 50 psi and 150 psi. In one embodiment, the structure is stable in a wet environment under a pressure ranging between 100 psi and 1000 psi. In one embodiment the structure is stable in a dry environment at a pressure ranging between 1 psi and 100 psi. In one embodiment, the structure is stable in a dry environment under a pressure ranging between 50 psi and 150 psi. In one embodiment, the structure is stable in a dry environment under a pressure ranging between 100 psi and 200 psi. In one embodiment, the structure is stable in a dry environment under a pressure ranging between 100 psi and 1000 psi. In one embodiment, wet environment comprises any environment wherein at least a portion of the structure is exposed to a liquid or to a liquid vapor. In one embodiment, the liquid comprises water. In one embodiment, dry environment is any environment wherein at least a portion of the structure is exposed to a gaseous material, to vacuum, to gas or to air at an equal pressure, a reduced pressure or at an elevated pressure as compared with atmospheric pressure.

In one embodiment, this invention provides a microfluidic device comprising an elastomer-primer-surface structure prepared by bonding two surfaces by a method comprising:
  associating a molecule comprising at least two silane-derivative groups with a first surface;
  contacting a second surface to said molecule comprising at least two silane-derivative groups.

In one embodiment, a microfluidic device is a device in which at least some of the dimensions of the channels or reservoirs used for retaining or transporting fluids in the device are on the micrometer scale. In one embodiment, the micrometer scale refers to a length unit ranging between 1 micrometer and 1000 micrometers. In one embodiment, microfluidic devices are used in or as biomolecule total analysis systems (so-called biomolecule μTAS). μTAS hold promise for automated biomolecule processing. Various biomolecule separation and purification steps, as well as chemical reaction and amplification have been miniaturized on a microchip, demonstrating orders of magnitude faster sample separation and processing. In addition, microfluidic integration of two different separation steps into a multidimensional separation device has been demonstrated. μTAS enables the detection, the analysis and sometimes the synthesis of biomolecules in a microfluidic device.

In one embodiment, the microfluidic device comprising at least two of the surface/primer/elastomer structures such that the two structures are bonded by the molecule comprising at least two silane-derivative groups.

In one embodiment, the microfluidic device further comprises a peristaltic pump. In one embodiment, a peristaltic pump is a displacement pump used for pumping a variety of fluids. The fluid is contained within a flexible tube fitted inside a circular pump casing. A rotor within the pump compresses the flexible tube. As the rotor turns, the part of tube under compression thus forcing the fluid to be pumped to move through the tube. As the tube opens to its natural state, fluid flow is induced to the pump. This process is called peristalsis.

In one embodiment the peristaltic pump is connected to a portion of the microfluidic device through a conduit. In one embodiment the conduit is a microfluidic channel or a tube.

In one embodiment, the peristaltic pump achieves consistent flow rates up to peristaltic cycle frequencies of 100 Hz in water, in up to 10 M HCl solution or in up to 10 M NaOH solution. In one embodiment, the peristaltic pump achieves consistent flow rates up to peristaltic cycle frequencies of 10 Hz in water, in up to 10 M HCl solution or in up to 10 M NaOH solution.

In one embodiment, this invention provides a micro total analysis system (μ-TAS) comprising a microfluidic device as described herein above.

In one embodiment, this invention provides a composition comprising a molecule comprising at least two silane-derivative groups. In one embodiment, the composition further comprises a solvent, a cure catalyst, a molecule comprising one silane-derivative group or a combination thereof.

In one embodiment, the ratio of the molecule comprising at least two silane-derivative groups to the molecule comprising one silane-derivative group is greater than 1:1.

In one embodiment, delamination refers to failure at the interfaces or within the primer such that the elastomer (PDMS) and substrate (PC, PMMA) can be detached from each other without mechanical failure of either the elastomer or substrate.

Figure 11:
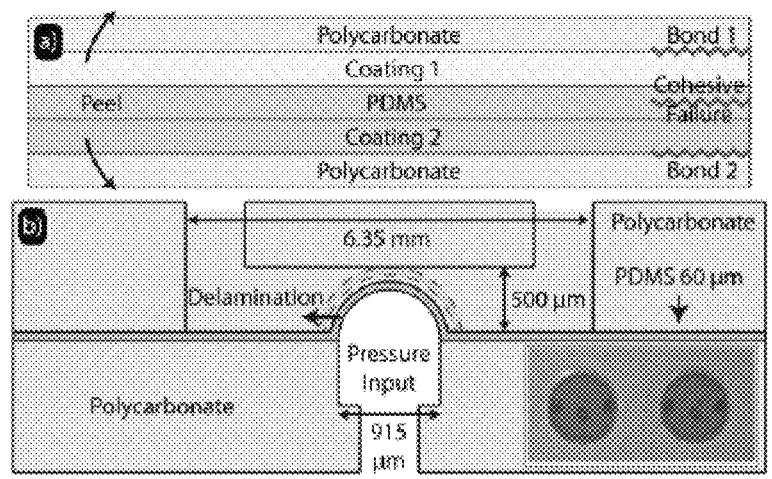
FIG. 11 illustrates: (a) schematic of the bond stack used for peel tests. PC layers are bonded to a PDMS membrane using silane coatings on either side, (b) Schematic of the aqueous blister test structure used to test hydrolytic bond failure. Suspended PDMS membranes were 60 um thick and 915 um in diameter. A picture of a fabricated blister test structure with the wells loaded with green dye is shown in the inset.

To test the effectiveness of the silanes for coupling PC to PDMS, peel test and blister test structures were used as shown in FIG. 11. For peel tests, PC-PDMS-PC stacks were bonded utilizing two different coating compositions on either side of the PDMS membrane as shown in FIG. 11a. Peel tests were performed by pulling apart the PC pieces and observing failure location. For blister tests, PDMS membranes are bonded between a layer of PC with 915 μm diameter holes and a layer of PC with 16 μL fluid reservoirs. This blister test structure simulates a microfluidic valve deflecting into an aqueous environment. As is typical for peristaltic valves, the critical bond interface between the PDMS membrane and the PC is separated from the fluid by the membrane. This enables testing bond strength as seen in the device, where liquids must diffuse through the PDMS to reach the bond interface of the actuation layer. Interface bond strength was first measured in air to determine bond strength. Wet strength was then tested under different conditions to determine the effects of interface and silane chemistry on hydrolytic resistance. Finally, peristaltic pumps are fabricated and tested for long term reliability in acidic, basic, and neutral environments.

PC-Silane Interface Bond Strength

In order to determine bond strength at the PC-silane interface, differential measurements of dry bond strength for different coating compositions are compared. In general, coating 1 is a reference coating consisting of BTISPA (BTMSPA aged for 2 weeks) which is known to have strong adhesion. Possible failures occur either at the PC-silane interfaces, or within the PDMS, since the plasma bonded interface between the coating and PDMS is not expected to fail in dry environments. Cohesive failure within the PDMS would indicate that bond strength is greater than the tensile strength of PDMS, or 1000 psi. Large alkoxy end groups on silane molecules are critical to achieving high bond strength. Small end groups, such as methoxy for BTMSPA, react directly with surface hydroxyl groups to form bonds via alcoholysis. As a result, a majority of weaker Si—O—C bonds are formed in comparison to silanes with larger alkoxy end groups. Sterically reducing alcoholysis by replacing methoxy groups with larger alkoxy groups will preferentially select for organofunctional bonding at the interface when silane coatings are applied. To demonstrate this process, a peel test between a newly mixed solution of BTMSPA in isopropanol and the reference BTISPA (FIG. 12a) is compared to a peel test for the same BTMSPA solution aged for 1 day and the reference BTISPA (FIG. 12b). While very difficult to peel, the BTMSPA coating from a new solution completely delaminates, as can be seen from the rainbow appearance indicating the BTMSPA coating is attached to the PDMS. In contrast, the BTMSPA coating aged in isopropanol for 1 day fails cohesively within the PDMS. This is an indication that interface bond chemistry is altered by isopropoxy transesterification of BTMSPA.

Similar peel tests were performed for a variety of coatings containing BTMSPA with exchanged end groups as well as for PECVD $SiO_2$ coatings. From the results shown in FIG. 13 (Table), cohesive failure occurs for coatings as alkoxy end groups become larger, with the minimal alkoxy group being ethoxy for cohesive failure. Tests comparing the bond strength of a non-functional silane BTESE (FIG. 13, Table 1g) versus its functional equivalent BTESPA (FIG. 13, Table 1h) also confirm the amine contribution to bond strength when large alkoxy groups are present. Bond failures for PECVD glass coatings, hydrolyzed silane coatings, and methoxy coatings (FIG. 13, Table 1b,e,f) demonstrate the reduced strength of Si—O—C bonds. Upon exposure of methoxy, hydroxyl, and $SiO_2$ coatings to water at 70 C for 2 hours, complete delamination occurs at pressures less than 45 psi (data not shown), below the membrane rupture pressure of 60 psi. These failures demonstrate the hydrolytic instability associated with Si—O—C bonds at the interface. For operation of valves in aqueous solutions, coatings using silanes with larger end groups are necessary to so increase the probability of interface amide bond formation.

Interface Hydrophobicity

Figure 14:
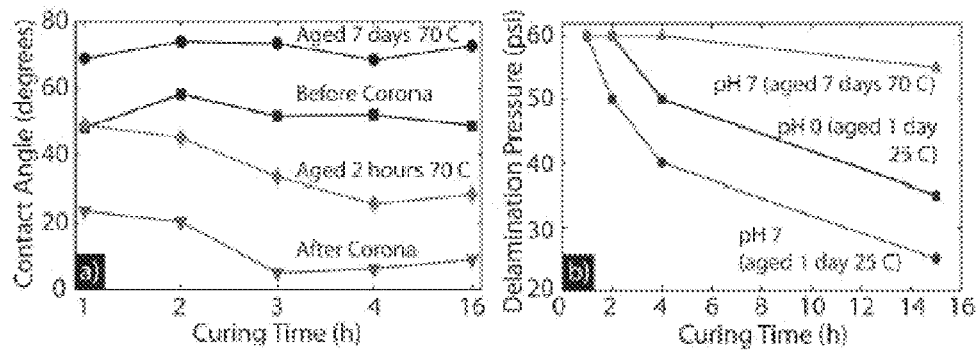
FIG. 14 illustrates (a) Water contact angles before and after corona treatment of cured silane layers. Hydrophobic recovery is slower for samples with prolonged curing times, (b) Delamination pressure of blisters after a 2 hour water bake at 70 C. Samples are bonded with corona treatment to PDMS after specified silane curing times. Delamination pressure decreases for samples bonded after longer curing times, but improves after aging bonded structures for 1 week at 70 C. Similar behaviors of contact angle and delamination pressure suggest that interface hydrophobicity plays a major role in hydrolytic resistance.

The PDMS-silane interface is also vulnerable to hydrolytic failure. The rate of hydrophobic recovery from corona treatment in relation to curing time can be seen from contact angle measurements shown in FIG. 14a. After aging for 2 hours at 70 C, samples exposed to corona treatment with longer curing times recovered their hydrophobicity slower. This hydrophobic recovery is correlated with interface hydrolytic resistance in FIG. 14b by measuring the delamination pressure versus curing time before corona treatment. Bonds with longer hydrophobic recovery result in lower delamination pressures when exposed to a 2 hour aqueous bake at 70 C. Acidic conditions are more resistant than neutral conditions, demonstrating that failure is caused by hydrolysis of Si—O—Si bonds. All silane coated surfaces eventually recover their hydrophobicity as well as improve their hydrolytic resistance, as demonstrated by both the contact angle recovery and the delamination recovery after baking bonded samples for one week at 70 C. Interestingly, for the coating which was cured for 15 hours before bonding, 1 week of hydrophobic recovery still did not result in recovered hydrolytic resistance. This could be an indication that the film has not recovered, or a small degree of hydrophilicity was permanently introduced. To prevent premature device failure, corona treatment must be initiated before the silane layer is fully cured and bonded chips should be aged until full hydrophobic recovery is achieved.

Crosslink Density and Hydrolytic Resistance

Figure 15:
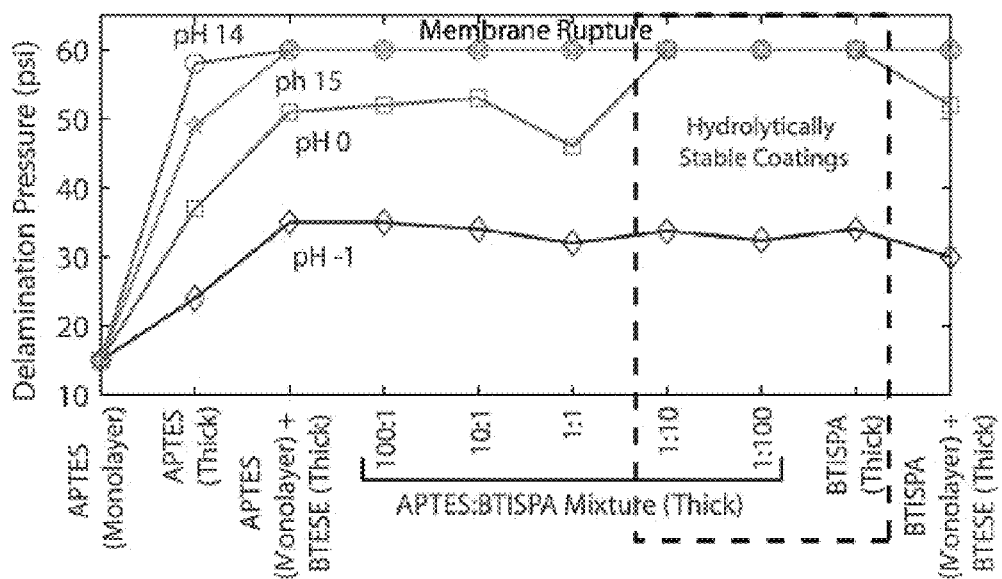
FIG. 15 is a plot of the delamination pressure versus primer type at pH extremes. Dotted area shows coatings that were stable from pH 0 to pH 15. Optimal hydrolytic stability occurs when coatings contain a majority of BTISPA, with failure only occurring at pH −1.

To determine the effect of bis-silanes on hydrolytic resistance, coatings utilizing different ratios of large alkoxy end group bis and regular silanes were explored. Monolayer coatings are not resistant to any aqueous conditions, most likely due to the inability to recover from corona treatment induced hydrophilicity. For thick coatings, all coatings containing bis-silanes have improved hydrolytic stability as shown in FIG. 15. As the concentration of BTISPA to APTES in the coating solution is increased, hydrolytic resistance improves over a wider pH range. This behavior saturates to hydrolytically stable bonds over a range of pH 0 to pH 15 when BTISPA is the majority of the mixture. Increased hydrolytic resistance can be attributed to the greater crosslink density for bis-silanes. Samples which fail only at pH −1 are strongly suggestive of amide bond formation, since Si—O—C bonds would likely delaminate at more mild pH. To further demonstrate the importance of bis-silane addition, two step coatings consisting of APTES or BTISPA as the organic-inorganic bonding layer and BTESE as the crosslink layer also showed improved hydrolytic resistance versus APTES coatings. This suggests that two step coatings can be used when bis-silanes with appropriate organic functionality are not available.

Criteria for Hydrolytic Stability

Bond strength tests reveal three major conditions for hydrolytically stable bond formation. First, dry peel tests demonstrate that strong organo-silane bonding to corona activated organic substrates such as PC require bonding from the organo-functional side of the silane molecule. This is accomplished by using silanes with bulky alkoxy groups bound to the silicon atoms, such as ethoxy or isopropoxy, to inhibit siloxane bond formation and promote organic bond formation. Second, hydrophobicity at the bond interface helps prevent bond hydrolysis and failure by preventing nucleation sites for water condensation at the interface. Corona bonding before the silane network is fully cured or post-baking at elevated temperature allows free hydrophilic groups to crosslink or to diffuse away from the interface. Lastly, silane crosslink density is important for stability of the crosslinked network. Increased crosslink density is achieved through the use of bis-silanes which contain six available silicon bonds in comparison to three on regular silanes.

Figure 10:
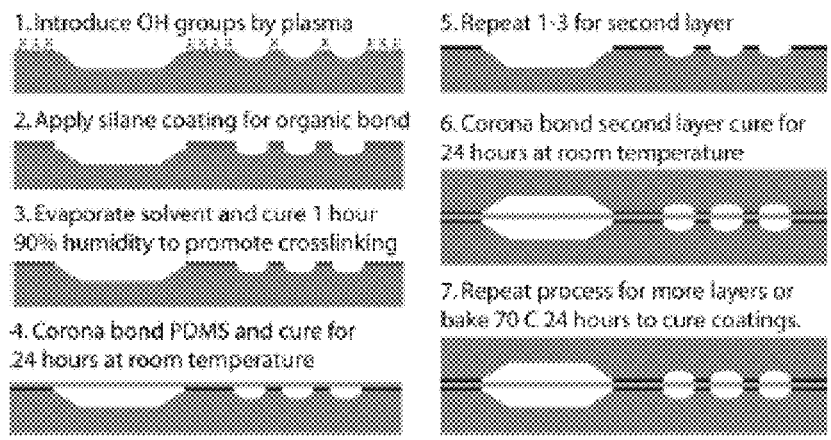
FIG. 10 illustrates fabrication process for bonding PC to PDMS using silane coatings. Curing and annealing steps are intentionally prolonged to ensure bond formation and hydrophobic recovery.

These three conditions are met following the fabrication process in FIG. 10 and utilizing a coating solution of 5% wt BTISPA in isopropanol with 0.5% wt TBT. Bonds from this coating are stable up to membrane rupture at 60 psi from pH 0 through pH 15. Interestingly, while NaOH even at concentrations as low as 1 M etched PC on the liquid side of the device during blister testing, the silane-PDMS layer protected the valve interface from similar attack, even at 10 M NaOH concentrations. Therefore, PC-silane-PDMS stacks could be used for improved resistance to NaOH solutions.

Reliability Testing

Figure 16:
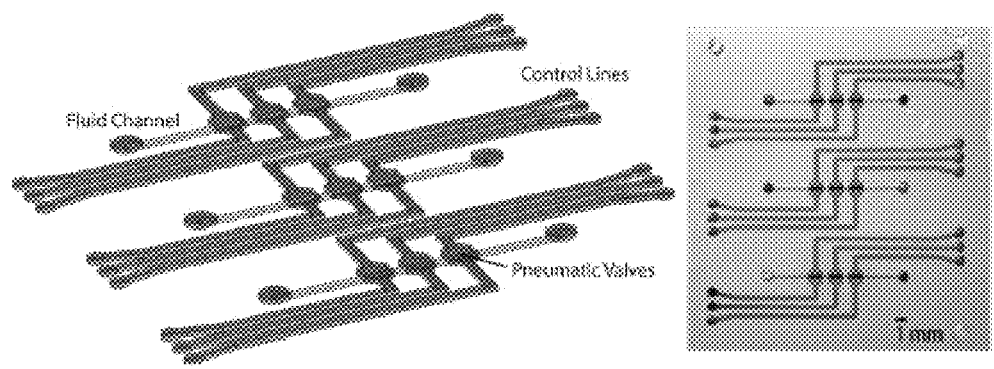
FIG. 16 is a schematic and picture of one embodiment of a test device fabricated in PC utilizing a 60 µm PDMS membrane to provide pressure based actuation valves. Control lines are 500 µm wide and 250 µm high. The fluid channel is 125 to 150 µm deep with a radius of curvature of 400 µm with a 1.6 mm valve length. Variation in depth results from machining inaccuracies.

In one embodiment, this process allows for bonding an arbitrary number of plastic layers separated by PDMS membranes, making multiple active layers in a single device possible. Since bonds are stable to high pressure, direct integration of manifolds and fluidic interfaces are also possible. To test the reliability in a working microfluidic system, a test chip consisting of three valve peristaltic pumps was fabricated as shown in FIG. 16.

Figure 17:
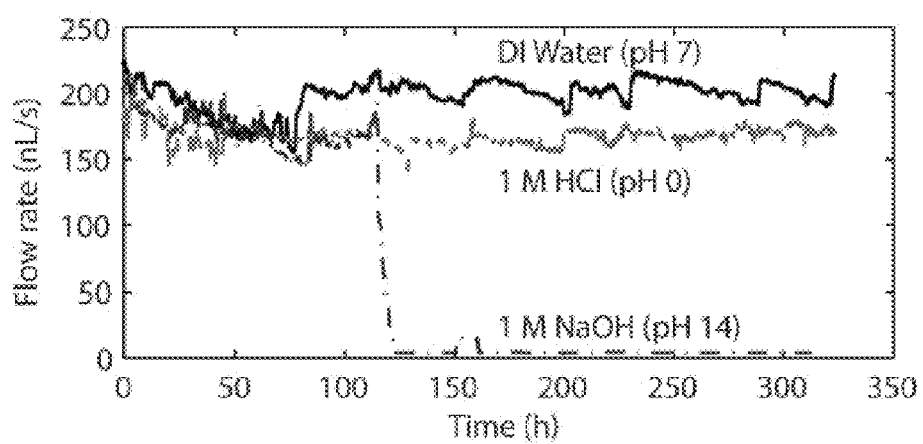
FIG. 17 is plot of the flow rate versus time for three different peristaltic pumps flowing different pH solutions at 18 psi. Pumping rate is 1 cycle every 500 ms. Marginal decrease in flow rate over the course of the experiment demonstrates long term bond reliability.

In one embodiment, external lines were connected with PTFE tubing and epoxy to prevent chemical reactions with interface materials. Reliability testing was performed by monitoring flow rate for each pump over the course of 2 weeks continuous operation at room temperature and 1 M HCl (pH 0), DI water (pH 7), and 1 M NaOH (pH 14). Higher concentrations of acid and base were not attempted since bond experiments showed that 10 M HCl resulted in interface bond failure and 10 M NaOH readily etched PC. The pumps were cycled with 5 states, (OOX, XOX, XOO, XXO, OXX), where X is a closed valve and O is an open valve, at a cycle period of 500 ms and a pressure of 18 psi to generate one unit of flow. Flow rates were measured by weighing the collected outflow with a scale for every 50 injection cycles. The plot of average flow rate for 1000 cycles versus time shown in FIG. 17 demonstrates peristaltic pump reliability in high molarity acidic and basic conditions for 2 weeks. Variations in actual flow rates are caused by stagnant bubbles introduced through valve pressurization. While DI water and 1 M HCl are stable for 2 weeks, NaOH at 1 M leads to device failure after 115 hours. As observed for blister tests, this failure occurs at the fluid layer PC-silane interface and has no effect on the control layer bond interface. Failure could result from either dissolution of the silane in contact with NaOH, or etching of the PC. Therefore, other plastic materials or measures to reduce direct contact between NaOH solutions and the PC-silane interface are necessary in one embodiment, if long term exposure to NaOH is required.

Migration from PDMS to plastics for microfluidics requires integration of flexible membranes into plastic devices for valve functionality. Organo-functional silanes provide a class of molecules capable of forming reliable bonds between plastics and silicon containing elastomers for valve applications. However, for bonds to be stable to hydrolysis, bond chemistry, interface hydrophobicity, and silane crosslink density must be addressed to prevent hydrolytic attack and premature valve failure. For a generally useful bonding process, dependence of bond strength on substrate and silane chemistry should be reduced. In one embodiment, to achieve this generality, the developed bonding processes of this invention uses corona treatment to introduce reactive groups on plastic surfaces and sterically hindered functional silanes to increase the probability of forming organic bonds with those reactive groups. The same process has also been applied to PMMA and polystyrene with similar results, suggesting that the bonding process could be applied to a variety of different plastics. By optimizing the hydrolytic stability for silane coatings on PC surfaces, it was shown that plastic-PDMS devices consisting of peristaltic pumps can be fabricated and operated at 18 psi in 1 M NaOH, with failure after 115 hours, and in 1 M HCl and DI water with no failure after 2 weeks. These time scales are compatible with many single use microfluidic experiments such as PCR, cell culture, and particle/cell manipulation. Such processes of the present invention enable a variety of new devices which can take advantage of both the rigidity offered by plastics and the flexibility offered by elastomers.

EXAMPLES

Materials and Methods

Isopropanol and titanium butoxide catalyst were purchased from Sigma Aldrich. Silane molecules Amino-Propyl-Triethoxy-Silane (APTES), Bis-Trimethoxy-Silyl-Propyl-Amine (BTMSPA), Bis-Triethoxy-Silyl-Propyl-Amine (BTESPA) and Bis-Triethoxy-Silyl-Ethane (BTESE) were purchased from Gelest Inc. Preparation of silane solutions involved mixing 5% weight silane in isopropanol. Transesterification of BTMSPA into BTISPA products was prepared by mixing 5% weight silane solutions in isopropanol with 0.5% weight Tetrabutyl Titanate (TBT) and aging in ambient conditions for a minimum of 2 weeks. Solutions aged for longer times gave better results, and it is suggested that partial polymerization of silane molecules due to contact with water occurs. Partial polymerization in solution likely increases overall crosslink density after coating. It is also speculated that if polymerization is required, direct addition of water to the solution can reduce aging times, provided that the water concentration is kept low enough not to cause gelation. While it has been seen that adding water to BTMSPA solutions causes gelation, transesterificated solutions are much more stable, making this a possible alternative to aging.

While partial transesterification rather than complete replacement of methoxy with isopropoxy groups results, hydrolytic resistance is still improved. Transesterification without TBT as a catalyst also proceeds, but takes significantly longer. Hydroxyl modified APTES (APTHS) was prepared by mixing 5% weight APTES in water and aging for 1 hour, generating a clear solution. Hydroxyl modified BTMSPA (BTHSPA) was prepared following manufacturer directions, by mixing a solution of 95% ethanol and 5% water adjusted to pH 5 with acetic acid and then adding 5% weight BTMSPA into the solution. Due to the instability of this solution, coatings were carefully applied before precipitation. Glass coatings were PECVD deposited on PC to 200 nm thickness. PC samples purchased from McMaster Carr under the tradename Makrolon were first machined using a mill to create test structures. Samples were then cleaned with isopropanol followed by mild corona discharge (5 to 15 seconds) to promote surface activation. Prolonged activation with corona discharge or activation with an oxygen plasma chamber was not used due to noticeable plastic and silane degradation and over-generation of hydrophilic groups. Mixed silane solutions were then wiped onto the corona activated surface with a 'cuetip' and the solvent was allowed to evaporate. For "monolayer" coatings, the coated surfaces were again rinsed thoroughly with isopropanol after initial coating to remove any unbound silane molecules from the surface. A second silane coating consisting of BTESE was then optionally applied to form the crosslinked over-coating. After allowing for solvent evaporation, coated surfaces were placed into a high humidity environment (>90%) at 70 C for 30 minutes to 1 hour to cure the coating. After curing, the layers were exposed to corona again, and bonded to a corona activated cured PDMS layer. The PDMS layer is prepared by spin coating PDMS onto a 3M high temperature transparency (PP2950) and baking at 70 C for 4 hours. Bonded samples are cured at room temperature for 24 hours to ensure full siloxane bond formation without thermal stress induced delamination.

In some embodiments, ambient cure is necessary since the initial bonds formed between the PDMS and silane layer can be separated. Subsequent layers are then coated and bonded with the same procedure. The chip is then baked at 70 C for 24 hours to accelerate hydrophobic recovery. A detailed illustration of the bonding process is given in FIG. 10. While curing and annealing steps can be shortened significantly, 24 hours ensured bond formation without complications. Acid and base testing was performed using 10 M HCl and 10 M NaOH subsequently diluted to reach different pH values.

Example 1

A Molecule Comprising Two Silane-Derivative Groups for Enhanced Bonding of Elastomer to Plastic Two molecules containing bis-silanes derivatives were investigated for improving bond strength: BisTriEthoxySilylEthane (BTESE) and Bis(TriMethoxySilylPropyl)Amine (BTMSPA). For BTESE, primers consisted of a two step process, wherein a molecule bearing one functional silane-derivative was first coated onto the plastic substrate for covalent bonding. This step was followed by coating with BTESE. Separately, in a one step coating process, a mixture of two molecules was used. The mixture contained one molecule bearing one functional silane-derivative and one molecule bearing two-functional silane-derivative molecule. The molecule bearing one silane-derivative was APTES and the molecule bearing two silane-derivative was Bis(TriMethoxySilylPropyl)Amine (BTMSPA). Coating a substrate by this mixture resulted in a thick single step coating. The coating layers were explored for its effects on hydrolytic stability.

5 wt % silane with 0.2 wt % Titanium Butoxide solutions in isopropanol were prepared and wipe coated on plasma treated plastic substrates. After curing, the layers were plasma bonded to PDMS substrates and allowed to cure for 24 hours.

Figure 2:
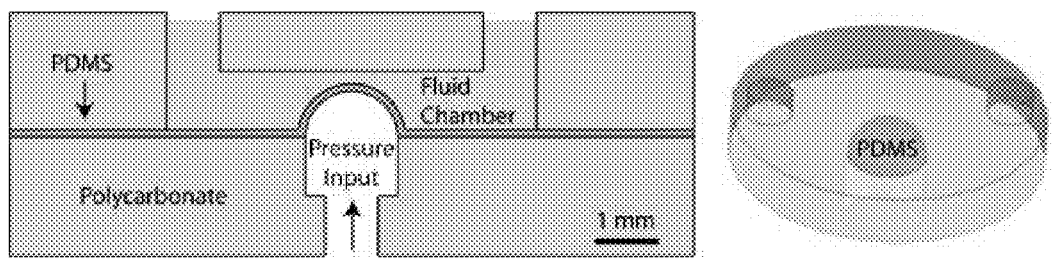
FIG. 2 is a schematic of the aqueous blister test structure utilized to test hydrolytic bond failure. PDMS membranes were 70 μm thick over 915 μm diameter circles.
Figure 3:
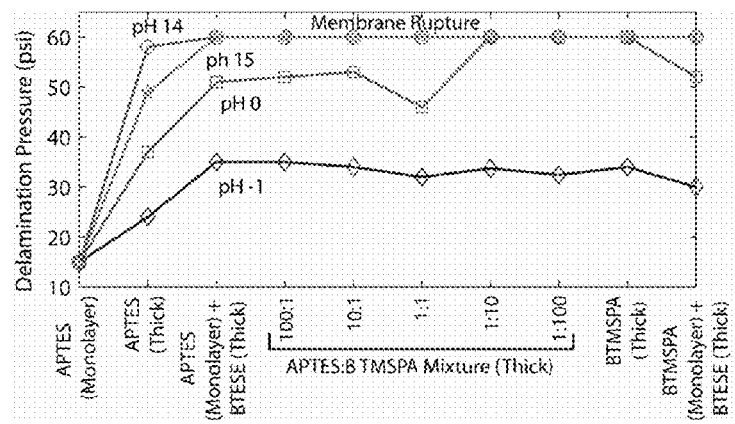
FIG. 3 is a plot of the delamination pressure versus primer type at pH extremes. Hydrolytic stability increases with addition of BTMSPA or protection by BTESE.
Figure 4:
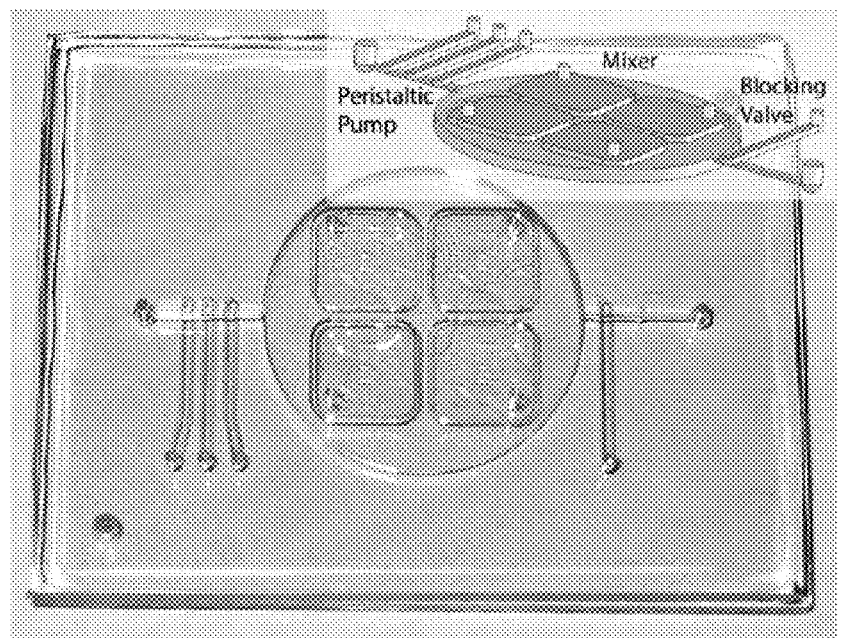
FIG. 4 is a schematic and picture of the test device fabricated in polycarbonate with a 70 μm PDMS membrane.
Figure 5:
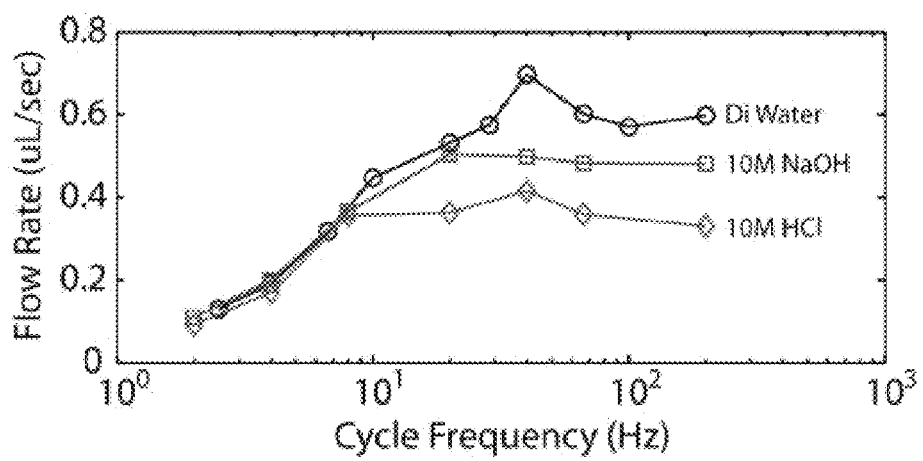
FIG. 5 is a plot of the flow rate versus frequency for different pH solutions at 15 psi for an 800×600 μm² cross section membrane peristaltic pump. Performance degradation at higher frequencies likely results from valve sticking due to acid/base modification of the PDMS and silane surfaces.

Devices with PDMS membranes suspended over 25 μL fluid reservoirs were fabricated in PC and PMMA to test interface robustness using blister test structures as shown in FIG. 2. Devices were fabricated using primer solutions with varying ratios of APTES and BTMSPA with and without BTESE. For the test device, membrane ruptures occurred instead of delamination.

at 60 psi for both PMMA and PC, suitable for active valves. For hydrolysis testing, blisters are subjected to NaOH and HCl solutions from the PDMS side at 70° C. for 2 hours followed by pressure testing. From FIG. 3, hydrolytic stability is shown to improve over direct APTES primers with the addition of BTMSPA for thick coatings or BTESE secondary layers for monolayer coatings. A test chip utilizing the highest performance primer was fabricated. The test chip contained peristaltic pumps and mixers and is shown in FIG. 4. Pump rate versus frequency was measured as shown in FIG. 5.

By utilizing two-stage application of silane primers on PC and PMMA surfaces, we have shown that hydrolytically stable hybrid plastic-PDMS devices consisting of valves, pumps, and mixers can be fabricated consistently. The interface of such devices was shown to be stable through 30 psi for pH −1 to 15 and greater than 60 psi for pH 0 to 15.

Example 2

Deposition of Organo-Silane Molecules on a Substrate using a Functional Group Other than the Silane-Derivative Group For deposition of organosilanes bonding to the surface through a non-silaneous organic group first, appropriate hydrolytic resistance of the silicon-alkoxy bonds must be present. This allows hydroxyl surface activated sites to bond to a non-silaneous organic group of the organosilane and prevent weak and hydrolytically unstable C—O—Si bonding between the primer's silane moiety and the hydroxylated surface.

Hydrolytically resistant organo-silanes can either be purchased or made through solvent exchange.

For the deposition process, 5 wt % BTMSPA is immersed in isopropanol and allowed to sit until appropriate solvent exchange occurs converting many methoxy groups to isopropyl alkoxy groups. BTMSPA is thus transformed into BTISPA. This is measurable by hydrolysis rates, where a solvent exchanged conversion to BTISPA will hydrolyze slowly in water in comparison to BTMSPA which will precipitate quickly in water, on the order of 5 minutes.

The solution containing BTISPA was mixed with a 5 wt % moisture cure catalyst such as Titanium Alkoxide (TA) in Isopropanol. Specifically Titanium Isopropoxide or Titanium Butoxide in an Isopropanol solution was used. The ratio of BTISPA to Titanium Alkoxide was 10:1.

Since the Silicon atoms were blocked from covalent bonding to each other or to the surface, the surface could be modified, for example with chemicals or through plasma, to introduce hydroxyl groups on the surface of the organic substrate (C—O—H bonds). The 10:1 BTISPA to TA solution was then either applied through dip coating, spraying, or wiping onto the organic surface. Thick films (~100's of nm) were deposited such that the primer film could cross-link into a stable layer.

The solution was then baked in high humidity at 70° C. for 1 hour to promote initial cross linking. It should be noted that after the first hour, the film was water resistant but still readily dissolved in isopropanol.

A layer of PDMS was then bonded to the surface after plasma activation of both the primer layer and the PDMS layer.

This structure was baked at 70° C. dry for 1 hour to promote breaking of hydrogen bonds (see FIG. 6), by eliminating a water molecule from the hydrogen-bonded area. Water molecule elimination promotes a Si—O-surface covalent bond. The water molecules were evaporated from the hydrogen bonds, which resulted in covalent bond formation.

This bonded structure (plastic/primer/PDMS) was then stable against aqueous solutions from pH 0 through pH 15 at 70° C.

Protic solvent resistance was also improved over conventional primer containing structures after aging the bonded device at 105° C. or by immersion into a 70° C. water bath for an arbitrary amount of time greater than 1 hour.

The finished device withstood immersion in pH 0 through pH 15 as well as immersion in isopropanol for days at 70° C. without failure as tested through 60 psi blister tests.

In one embodiment, the following procedure is an alternative or a complementary or an optimized procedure or may be included or may comprise the procedure described above:
Solution Preparation and "Aging"

Bistrimethoxysilylpropylamine(BTMSPA) is mixed with isopropanol in a 5:95 weight ratio and reacted in a closed bottle for 1 month at room temperature, optionally with 0.05% to 0.5% weight titanium butoxide catalyst added. The resulting partially transesterificated solution is very hydrophobic and reacts very slowly with water, and has a different polymerization process. Under extreme water exposure testing, isopropoxy transesterificated BTMSPA in solution precipitates as a granular white powder in contrast to methoxy BTMSPA which forms large branched macroscopic polymer chains. Following the transesterification reaction, the solution is mixed with water in a molar ratio of 1:1 to 15:1 water to BTMSPA and further reacted for 1 month. The resulting solution is properly pre-polymerized and ready for use.
Surface Preparation Surfaces are prepared in a manner to generate carboxyl groups. This is done either by grafting bridging molecules with carboxyl functionalities, reactions with ozone through plasma or corona, or reactions with lysing agents such as strong acids or bases (in the case of polymers which can form carboxyl groups through lysis, i.e. polycarbonate, pmma, PET).

In the current example, corona treatment and wet etching with sodium hydroxide are used on polycarbonate and PMMA surfaces. After initial surface activation, samples are washed in DI water and isopropanol to remove resulting low MW polymers from the surface as a byproduct of the activation reaction. Then the surfaces are washed in HCl for 15 min to 1 hour from room temperature to 70 C to remove generated surface peroxides, bound alkaline ions, and hydrolyze any other free oxygen radicals to hydroxyl groups.

Solution Deposition and Reaction

Prepolymerized solutions in isopropanol are applied to activated surfaces by wiping, dipping, spraying, or any other method available to form a thin uniform layer. The surfaces are then placed in a >60% humidity oven at 70 C to 100 C for 1 hour to form amide bonds between the BTMSA polymers and the surface carboxyl groups as well as crosslink BTMSA polymers through condensation reactions. After removal from the humidity oven, samples are treated for 5 seconds with corona discharge and PDMS membranes are treated for 15 seconds with corona discharge. The layers are then bonded by pressing them together and storing in a dry environment for 2 to 24 hours, optionally by heating in an oven.

Results

Bonded structures and devices are resistant to boiling water, pH 0 acid, and pH 14 base for over 1 month when subjected to solutions from the PDMS side.

In the claims articles such as "a,", "an" and "the" mean one or more than one unless indicated to the contrary or otherwise evident from the context. Claims or descriptions that include "or" or "and/or" between members of a group are considered satisfied if one, more than one, or all of the group members are present in, employed in, or otherwise relevant to a given product or process unless indicated to the contrary or otherwise evident from the context. The invention includes embodiments in which exactly one member of the group is present in, employed in, or otherwise relevant to a given product or process. The invention also includes embodiments in which more than one, or all of the group members are present in, employed in, or otherwise relevant to a given product or process. Furthermore, it is to be understood that the invention provides, in various embodiments, all variations, combinations, and permutations in which one or more limitations, elements, clauses, descriptive terms, etc., from one or more of the listed claims is introduced into another claim dependent on the same base claim unless otherwise indicated or unless it would be evident to one of ordinary skill in the art that a contradiction or inconsistency would arise. Where elements are presented as lists, e.g., in Markush group format or the like, it is to be understood that each subgroup of the elements is also disclosed, and any element(s) can be removed from the group.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

What is claimed is:

1. A method of bonding two surfaces said method comprising:
associating a molecule comprising at least two silane-derivative groups with a first surface;
contacting a second surface to said molecule;
wherein said first surface is a plastic material, and said second surface is an elastomer comprising Si, and wherein said second surface is a solid or cured surface;
wherein said molecule comprising at least two silane-derivative groups has formula $(Y)_m(Z)_{3-m}Si—X—Si(Y)_m(Z)_{3-m}$ or formula $(Y)_m(Z)_{3-m}Si—X—R—X—Si(Y)_m(Z)_{3-m}$, wherein X is a $C_1$-$C_{10}$ branched or unbranched alkyl chain, Y and Z are alkoxy groups, m is 1-3, and R is an organic reactive group, and
wherein at least one of Y and Z is a bulky alkoxy group.

2. A method of bonding two surfaces said method comprising:

a. associating a molecule comprising at least two silane-derivative groups with a first surface;
b. contacting a second surface to said molecule,
wherein said first surface is a plastic material, and said second surface is an elastomer comprising Si, and wherein said second surface is a solid or cured surface.

3. A method of bonding two surfaces said method comprising:
a. associating a molecule comprising at least two silane-derivative groups with a first surface;
b. contacting a second surface to said molecule;
wherein said first surface is a plastic material, and said second surface is an elastomer comprising Si,
wherein said molecule comprising at least two silane-derivative groups has formula $(Y)_m(Z)_{3-m}Si—X—Si(Y)_m(Z)_{3-m}$ or formula $(Y)_m(Z)_{3-m}Si—X—R—X—Si(Y)_m(Z)_{3-m}$, wherein X is a $C_1$-$C_{10}$ branched or unbranched alkyl chain, Y and Z are alkoxy groups, m is 1-3, and R is an organic reactive group, and
wherein at least one of Y and Z is a bulky alkoxy group of isopropoxy.

4. The method of claim 2, wherein said plastic material comprises polycarbonate (PC), polymethylmethacrylate (PMMA) or polystyrene (PS).

5. The method of claim 2, wherein before said associating step, a molecule comprising at least one silane-derivative group is applied to said first surface.

6. The method of claim 2, wherein said associating step comprises evaporating said molecule onto said first surface.

7. The method of claim 2, wherein said associating step comprises depositing said molecule from solution onto said first surface.

8. The method of claim 7, wherein said at least two silane-derivative groups in said molecule are hydrolytically stable.

9. The method of claim 8, wherein said deposition prevents hydrolytically unstable (e.g. Si—O—C) bonds from forming between said molecule comprising at least two silane derivative groups and said first surface.

10. The method of claim 7, wherein said depositing from said solution comprises dip-coating or spin-coating said first surface by said solution, or spraying or wiping said first surface with said solution.

11. The method of claim 2, wherein said associating step comprises depositing said molecule from a melt.

12. The method of claim 2, wherein said molecule associated with said first surface form a 3D crosslinked structure on said first surface.

13. The method of claim 12, wherein the thickness of said 3D crosslinked structure ranges between 50 nm and 200 nm.

14. The method of claim 2, wherein after said contacting step, pressure is applied to at least a portion of said first surface, said second surface or a combination thereof.

15. The method of claim 2, wherein before or after said associating step, said first surface, said second surface or a combination thereof are treated.

16. The method of claim 15, wherein said treating step comprises plasma treatment.

17. The method of claim 15, wherein said treating step comprises chemical treatment, a mechanical treatment or a combination thereof.

18. The method of claim 2, wherein before and/or after said contacting step, an annealing or a baking or a curing step is performed.

19. The method of claim 18, wherein said annealing or baking or curing step enhances the bonding between said first surface and said molecule, between said second surface and said molecule or a combination thereof.

20. The method of claim 18, wherein said annealing or baking or curing step recovers hydrophobicity of said first surface, said second surface, said molecule or a combination thereof by removing hydrophilic end groups.

21. The method of claim 18, wherein said annealing or said baking or said curing is conducted at a temperature ranging between 50° C. and 200° C.

22. The method of claim 18, wherein said annealing or said baking or said curing is conducted at 70° C.

23. The method of claim 18, wherein said annealing or said baking or said curing is conducted at 105° C.

24. The method of claim 18, wherein said annealing or said baking or said curing is conducted for a period ranging from 20 h to 30 h.

25. The method of claim 18, wherein said annealing or said baking or said curing is conducted for a period ranging from 0.5 h to 3 h.

26. The method of claim 18, wherein said annealing is conducted under dry conditions.

27. The method of claim 2, wherein said Si is in the form of a siloxane.

28. The method of claim 27, wherein said siloxane comprises polydimethylsiloxane (PDMS).

29. The method of claim 28, wherein the thickness of said PDMS ranges between 10 μm and 200 μm.

30. The method of claim 8, wherein the thickness of said PDMS is approximately 70 μm.

31. The method of claim 2, wherein said molecule comprising at least two silane-derivative groups is of the formula: $(Y)_m(Z)_{3-m}$—Si—X—Si—$(Y)_m(Z)_{3-m}$ wherein X is a $C_1$-$C_{10}$ branched or unbranched alkyl chain and Y and Z are alkoxy groups.

32. The method of claim 31, wherein said Y is an ethoxy group and said Z is a methoxy group.

33. The method of claim 31, wherein said molecule comprising at least two silane-derivative groups is bis(triethoxysilyl) ethane (BTESE).

34. The method of claim 2, wherein said molecule comprising at least two silane-derivative groups is of the formula: $(Y)_m(Z)_{3-m}$—Si—X—R—X—Si—$(Y)_m(Z)_{3-m}$ wherein X is a $C_1$-$C_{10}$ branched or unbranched alkyl chain, Y and Z are alkoxy groups and R is an organic reactive group.

35. The method of claim 34, wherein at least one of Y and Z is a bulky alkoxy group.

36. The method of claim 35, wherein said bulky alkoxy groups are isopropanol groups.

37. The method of claim 35, wherein said bulky alkoxy groups protect said silane-derivative groups from covalently bonding to said first surface, such that desired non-silaneous bond formation between said first surface and said molecule can be formed.

38. The method of claim 34, wherein said Y is an isopropyl alkoxy group and said Z is a methoxy group.

39. The method of claim 34, wherein said organic reactive group R comprises an amine, a hydroxy group, an ester group, a phosphate group, a sulfate group, a nitro group, a cyano group, a vinyl group, an acrylate group, a methacrylate group or a carboxylic acid group.

40. The method of claim 34, wherein said organic reactive group R is covalently-bonded to said first surface.

41. The method of claim 34, wherein said molecule comprising at least two silane-derivative groups is Bis(Tri-MethoxySilylPropyl)Amine (BTMSPA), Bis(TrilsopropylSilylPropyl)Amine (BTISPA) or a combination thereof.

42. The method of claim 34, wherein said molecule comprising at least one silane-derivative group is of the formula: R—X—Si—$(Y)_m(Z)_{3-m}$ wherein X is a $C_1$-$C_{10}$ branched or unbranched alkyl chain, Y and Z are an alkoxy group and R is an organic reactive group.

43. The method of claim 42, wherein said organic reactive group R comprises an amine, an hydroxy group, an ester group, a phosphate group, a sulfate group, a nitro group, a cyano group, a vinyl group, an acrylate group, a methacrylate group or a carboxylic acid group.

44. The method of claim 42, wherein said organic reactive group is covalently-bonded to said first surface.

45. The method of claim 42, wherein said Y is an isopropyl alkoxy group and said Z is a methoxy group or an ethoxy group.

46. The method of claim 42, wherein said molecule comprising at least one silane-derivative group is aminopropyl triethoxysilane (APTES).

47. The method of claim 7, wherein the solvent of said solution comprises isopropanol.

48. The method of claim 7, wherein said solution comprises a cure catalyst.

49. The method of claim 48, wherein the concentration of said catalyst in said solution ranges between 0.05 wt% and 1.0 wt%.

50. The method of claim 48, wherein the concentration of said catalyst in said solution is 0.2 wt%.

51. The method of claim 48, wherein said catalyst is a moisture cure catalyst.

52. The method of claim 51, wherein said moisture cure catalyst is titanium alkoxide (TA).

53. The method of claim 48, wherein the ratio between said molecule comprising at least two silane-derivative groups and said cure catalyst ranges between 0.9:1 and 1.1:1.

54. The method of claim 48, wherein the ratio between said molecule comprising at least two silane-derivative groups and said cure catalyst is greater than 1:1.

55. The method of claim 54, wherein the ratio between said molecule comprising at least two silane-derivative groups and said cure catalyst ranges between 9:1 and 11:1.

56. The method of claim 54, wherein the ratio between said molecule comprising at least two silane-derivative groups and said cure catalyst ranges between 2:1 and 8:1.

57. The method of claim 7, wherein said solution comprises between 1 wt% to 10 wt% of said molecule comprising at least two silane-derivative groups.

58. The method of claim 57, wherein said solution comprises approximately 5 wt% of said molecule comprising at least two silane-derivative groups.

59. The method of claim 18, wherein said annealing is conducted under wet conditions.

* * * * *